US005644308A

United States Patent [19]
Kerth et al.

[11] Patent Number: 5,644,308
[45] Date of Patent: Jul. 1, 1997

[54] ALGORITHMIC ANALOG-TO-DIGITAL CONVERTER HAVING REDUNDANCY AND DIGITAL CALIBRATION

[75] Inventors: Donald A. Kerth; Brian D. Green, both of Austin, Tex.

[73] Assignee: Crystal Semiconductor Corporation, Austin, Tex.

[21] Appl. No.: 372,954

[22] Filed: Jan. 17, 1995

[51] Int. Cl.$^6$ ............................................. H03M 1/10
[52] U.S. Cl. ............................................. 341/120; 341/162
[58] Field of Search ................................. 341/118, 120, 341/155, 161, 162, 163

[56] References Cited

U.S. PATENT DOCUMENTS

| | | | |
|---|---|---|---|
| 4,272,760 | 6/1981 | Prazak et al. | 340/347 |
| 4,336,526 | 6/1982 | Weir | 340/347 |
| 4,340,882 | 7/1982 | Maio et al. | 340/347 |
| 4,381,495 | 4/1983 | Hotta et al. | 340/374 |
| 4,799,041 | 1/1989 | Layton | 341/120 |
| 4,943,807 | 7/1990 | Early et al. | 341/120 |
| 5,008,854 | 4/1991 | Maeda et al. | 364/900 |
| 5,027,116 | 6/1991 | Armstrong et al. | 341/120 |
| 5,047,772 | 9/1991 | Ribner | 341/120 |
| 5,087,914 | 2/1992 | Sooch et al. | 341/120 |
| 5,248,970 | 9/1993 | Sooch et al. | 341/120 |
| 5,327,163 | 7/1994 | Hashimoto et al. | 345/173 |
| 5,331,321 | 7/1994 | Mannonen | 341/120 |
| 5,416,485 | 5/1995 | Lee | 341/162 |
| 5,499,027 | 3/1996 | Karanicolas et al. | 341/120 |
| 5,510,789 | 4/1996 | Lee | 341/120 |

OTHER PUBLICATIONS

Ginetti et al., "A CMOS 13-b Cyclic RSD A/D Converter," IEEE Journal of Solid-State Circuits, vol. 27, No. 7, Jul. 1992, pp. 957-965, IEEE, New York, N.Y.

Ohara et al., "A CMOS Programmable Self-Calibrating 13-bit Eight-Channel Data Acquisition Peripheral," IEEE Journal of Solid-State Circuits, vol. SC-22, No. 6, Dec. 1987, pp. 930-938, IEEE, New York, N.Y.

"Working Concepts—BRADYTOUCH Analog Resistive Touch Panel," Thin Film Products/Application Notes, 1991, W.H. Brady Co., 8225 W. Packard Ct., P.O. Box 571, Milwaukee, WI.

Maio et al., "An Untrimmed D/A Converter with 14-Bit Resolution," IEEE Journal of Solid-State Circuts, vol. SC-16, No. 6, Dec. 1981, pp. 616-620, IEEE, New York, N.Y.

*Primary Examiner*—Howard L. Williams
*Attorney, Agent, or Firm*—Arnold, White & Durkee

[57] ABSTRACT

An algorithmic converter system includes an algorithmic converter having a loop gain substantially less than two for converting an analog input signal to a redundant digital code; and a digital computation unit for converting the redundant digital code to a digital output signal by computing a polynomial of a radix, said radix being substantially equal to the loop gain, wherein the redundant digital code specifies coefficients of the polynomial. The redundancy extends the analog input conversion range with respect to the voltage reference of the algorithmic converter. Moreover, if the algorithmic converter has a maximum offset of $V_{offmax}$, a reference voltage of $V_{ref}$, and a loop gain less than $2/(1+V_{offmax}/V_{ref})$, then loop offset will not cause differential nonlinearities. Nonlinearity is further reduced by digitally compensating for variations in the loop gain. The method includes measuring the loop gain of said algorithmic converter, and setting the radix of the computation unit equal to the measured value of the loop gain. Preferably the loop gain is measured by converting two reference voltages to obtain two sets of digits from the algorithmic converter, and employing a successive approximation technique that alternately computes an offset value and adjusts the radix. For the redundant signed digit (RSD) algorithmic converter, rapid convergence is obtained using a zero reference voltage and a non-zero reference voltage. For a conventional restoring (CR) algorithmic converter, however, positive and negative reference voltages are used.

48 Claims, 21 Drawing Sheets

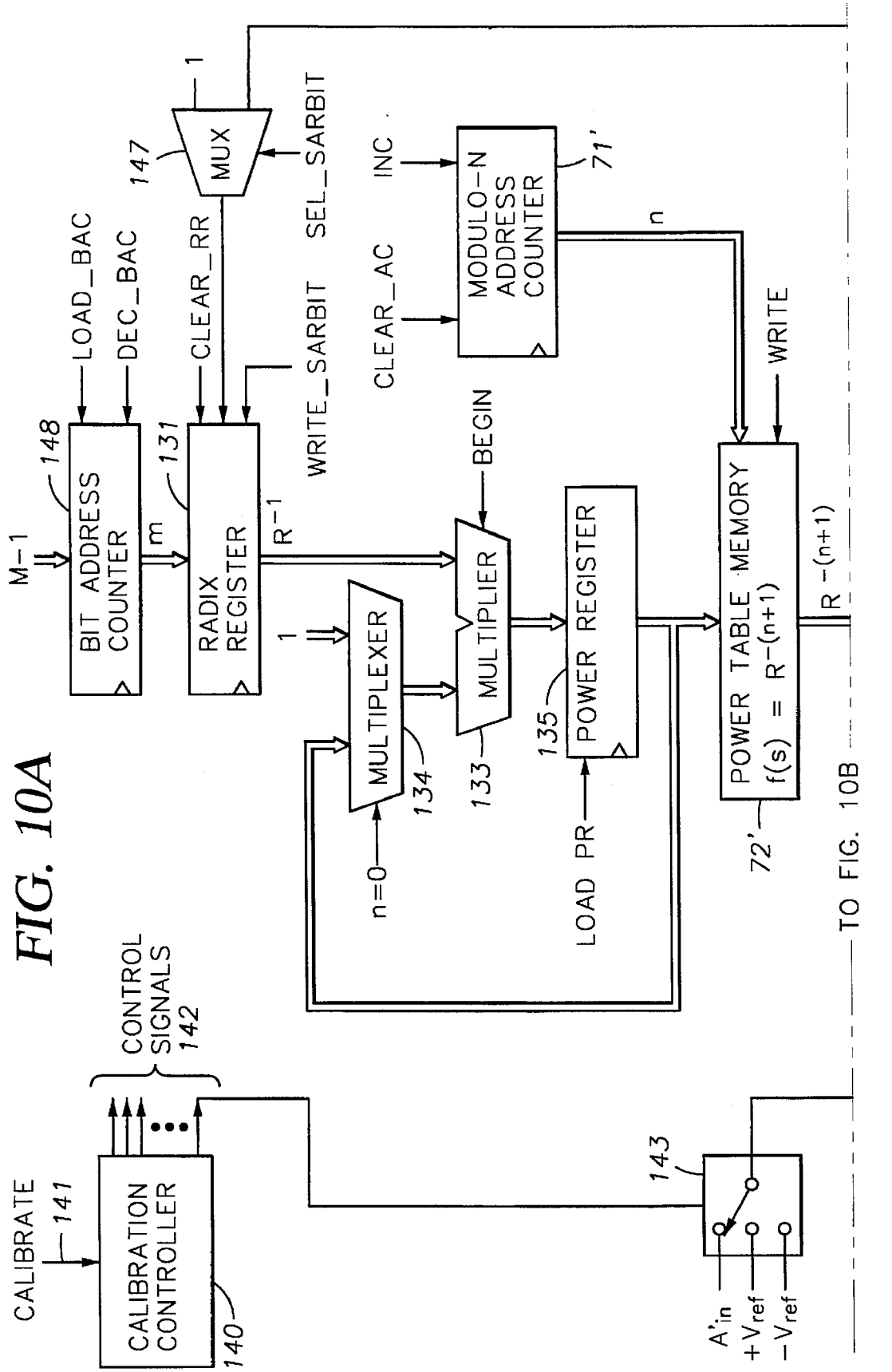

ALGORITHMIC ANALOG-TO-DIGITAL CONVERTER HAVING REDUNDANCY AND DIGITAL CALIBRATION

BACKGROUND OF THE INVENTION

1. Field of the Invention

The present invention relates generally to an algorithmic analog-to-digital converter. More particularly, the present invention relates to an algorithmic analog-to-digital converter having digital code redundancy and digital self-calibration for calibration of gain and reduction of offset, differential non-linearity and integral non-linearity.

2. Description of the Background Art

Analog-to-digital converters are in widespread use for interfacing analog signals to digital computers, and for digital signal processing of analog signals. There are various types of analog-to-digital converters, each having different cost and performance characteristics. The cost is dictated by circuit complexity and the technology needed to implement the circuit components. The performance characteristics are typically measured in terms of conversion speed, resolution, offset, differential non-linearity, integral non-linearity, and power consumption.

For many applications, analog-to-digital converters can be fabricated in analog complementary metal-oxide semiconductor (CMOS) technology to meet desired performance characteristics at low cost. Delta-sigma converters, successive approximation converters, and algorithmic converters have all been fabricated in CMOS technology, and each provides a particular combination of desired characteristics that could be best for a specific application. Delta-sigma ($\Delta$-$\Sigma$) converters provide the best performance and have a relatively small size on a CMOS integrated circuit chip, but delta-sigma converters have a relatively high power consumption. Successive approximation (SAR) converters provide the lowest power consumption but have a relatively large size. Algorithmic converters have low power consumption and small size.

An algorithmic converter typically uses a cyclic conversion procedure based on the conventional restoring (CR) numerical division principle. In the CR cyclic conversion procedure the signal to be converted is multiplied by two and the product is compared to a reference voltage: if the product is greater than the reference, then the most significant bit (MSB) of the output code is set to 1, and the reference is subtracted from the product; else the MSB is set to 0, and no subtraction is carried out. The remaining part of the product is the so-called "residue voltage" which corresponds to a partial remainder. The residue voltage undergoes the same multiply-by-two, comparison, and conditional subtraction operations to determine the next bit of the output code. The process is repeated to determine the remaining bits of the output code until the least significant bit (LSB) is obtained.

Algorithmic converters have required a precise multiplication-by-2 factor to obtain conversion linearity. For example, Armstrong et al. U.S. Pat. No. 5,027,116 issued Jun. 25, 1991, incorporated herein by reference, discloses a self-calibrating algorithmic analog-to-digital converter for which the gain of the conversion loop is precisely adjusted and controlled by an array of switched capacitors. The control for the switched capacitors is stored in a latch. The offset of the gain stage is reduced by reducing the amount of charge injected from the gate of the input zeroing MOS switch. Further details of such a self-calibrating algorithmic converter are disclosed in Ohara et al., "A CMOS Programmable Self-Calibrating 13-bit Eight-Channel Data Acquisition Peripheral," IEEE Journal of Solid-State Circuits, Vol. SC-22, No. 6, Dec. 1987, pp. 930–938, incorporated herein by reference.

Algorithmic converters are also known to suffer differential and integral nonlinearities unless the loop offset error is reduced to at least ½ LSB. The nonlinearities occur because excess offset causes the residue voltage to fall outside of the convergence domain. The nonlinearities can be avoided by using a redundant signed digit (RSD) procedure, in which only a global shift of the transfer characteristic is experienced in the presence of a loop offset error. As described in Ginetti et al., "A CMOS 13-b Cyclic RSD A/D Converter," IEEE Journal of Solid-State Circuits, Vol. 27, No. 7, Jul. 1992, pp. 957–965, incorporated herein by reference, the RSD procedure is similar to the CR cyclic conversion procedure, but at each bit decision, two comparison levels P and Q are used instead of one, with P positive and Q negative: if the product is greater than P, the output code bit is set to 1 and the reference is subtracted; if the product is less than Q, the bit is set to −1 and the reference is added; else, the bit is set to 0 and no addition or subtraction is performed. In addition to the extra comparator, the RSD converter requires a kind of adder circuit to convert the redundant code to a conventional binary representation. The RSD converter still requires a precise gain of 2 for the multiplication of the remainder, although it is said to provide one more bit of differential linearity than the cyclic conversion algorithm. To ensure a precise gain of 2, Ginetti et al. disclose a capacitor mismatch error cancellation technique that involves interchanging two capacitor pairs without using any extra clock phase and without using any extra hardware.

Although the RSD technique appears satisfactory for conversion at the 13-bit level, the RSD technique introduces an additional source of non-linearity not present in the CR cyclic conversion procedure. Because the RSD technique involves adjustment of the residue by three possible levels of $+V_{ref}$, 0, and $-V_{ref}$ it is necessary for these three levels to lie precisely on a straight line (within the resolution of the conversion) or else non-linearities will occur. Moreover, the Ginetti et al. capacitor mismatch error cancellation technique is ineffective for eliminating all sources of gain variation, such as capacitive coupling between amplifier inputs and outputs, which cause the gain to deviate from an exact value of 2.

SUMMARY OF THE INVENTION

In accordance with one aspect of the invention, there is provided an algorithmic converter system including: an algorithmic converter having a loop gain substantially less than two for converting an analog input signal to a redundant digital code; and a digital computation unit for converting the redundant digital code to a digital output signal by computing a polynomial of a radix, said radix being substantially equal to the loop gain, wherein the redundant digital code specifies coefficients of the polynomial. This algorithmic converter system has the advantage of providing redundancy that extends the analog input conversion range with respect to the voltage reference of the algorithmic converter. In particular, if the algorithmic converter has a maximum loop offset of $V_{offmax}$ and a reference voltage of $V_{ref}$ and the loop gain is selected to be less than 2/(1+ $V_{offmax}/V_{ref}$), then the loop offset will not cause differential nonlinearities. For analog CMOS, a loop gain of about 1.75 is preferred.

The present invention can be adapted to any kind of algorithmic converter. Although the conventional RSD algorithmic converter is tolerant of loop offsets, by using a loop gain substantially less than two, it is possible to ensure that loop offset will not cause the conversion characteristic of the RSD algorithmic converter to saturate within the input range of $-V_{ref}$ to $+V_{ref}$. More importantly, by using a loop gain substantially less than two, the CR algorithmic converter is made insensitive to loop offsets. The CR algorithmic converter is more desirable than the RSD converter for applications requiring low integral nonlinearity because the three feedback levels of the RSD algorithmic converter are not inherently linear and therefore introduce integral nonlinearity error, but this source of error is absent from the CR algorithmic converter, which has only two feedback levels.

The present invention is also directed to the problem of calibrating algorithmic converters. Severe differential non-linearities occur in a prior-art algorithmic converter when the loop gain of the converter deviates from a precise value of two. In accordance with another aspect of the present invention, non-linearity is eliminated by digitally compensating for variations in the loop gain. The method includes measuring the loop gain of the algorithmic converter, and setting the radix of the computation unit equal to the measured value of the loop gain.

In accordance with another aspect of the present invention, the loop gain of an algorithmic converter is measured by setting the analog input signal to a first reference voltage, and operating the algorithmic converter to determine a first set of digits corresponding to the first reference voltage; and setting the analog input signal to a second reference voltage, and operating the algorithmic converter to determine a second set of digits corresponding to the second reference voltage. The loop gain is computed from the first set of digits and the second set of digits. In this case, the loop gain R is a root of the polynomial equation:

$$0 = (A_1 - A_0)/V_{ref} + (b_0' - b_0'')R^{-1} + (b_1' - b_1'')R^{-2} + \ldots + (b_{N-1}' - b_{N-1}'')R^{-N}$$

wherein $A_0$ is the first reference voltage, $A_1$ is a second reference voltage, $V_{ref}$ is a reference voltage of the algorithmic converter, $b_0', b_1', \ldots, b_{N-1}'$ are the first set of digits of the digital code, and $b_0'', b_1'', \ldots b_{N-1}''$ are the second set of digits of the digital code. In general, it may be difficult to find the correct root of this polynomial equation. One method of finding the correct root is to iteratively perform the steps of computing an offset estimate $\hat{O}_i$:

$$\hat{O}_i = A_0/V_{ref} - (b_0'\hat{R}_i^{-1} + b_1'\hat{R}_i^{-2} + \ldots + b_{N-1}'\hat{R}_i^{-N})$$

where $A_0$ is the first reference voltage, $V_{ref}$ is a reference voltage of the algorithmic converter, $b_0', b_1', \ldots b_{N-1}'$ are the first set of digits of the digital code, and $\hat{R}_i$ is a nominal value of the loop gain, and then solving the polynomial equation $$0 = -A_1/V_{ref} + \hat{O}_i + b_0''R^{-1} + b_1''R^{-2} + \ldots + b_{N-1}''R^{-N}$$

where $A_2$ is the second reference voltage, and $b_0'', b_1'', \ldots, b_{N-1}''$ are the second set of digits of the digital code, and R is the loop gain. For an RSD algorithmic converter, this method will rapidly converge for $A_0$ at a zero reference level and $A_1$ at $+V_{ref}$ and $-V_{ref}$. For a CR algorithmic converter, however, convergence may not occur under these conditions when the polynomial equation is solved by a successive approximation method, although convergence will occur when one of $A_0$ and $A_1$ is $+V_{ref}$ and the other of $A_0$ and $A_1$ is at $-V_{ref}$.

The preferred calibration method has general applicability to adjustment of gain and offset of a converter having gain and offset adjustments that are not independent. Once the gain and offset are adjusted, a first input reference value becomes converted to a first output reference value, and a second input reference value becomes converted to a second output reference value. The preferred method includes: (a) setting the gain value to an initial value; (b) setting the offset value to an initial value corresponding to the first output reference value, and operating the converter to convert the first input reference value to a converted value to determine a new value for the offset value, and setting the offset value to the new value for the offset value; and (c) operating the converter to convert the second input reference value to a converted value, comparing the converted value to the second output reference value, and adjusting a bit of the gain value based on the comparing of the converted output value to the second output reference value; wherein the steps (b) and (c) are repeated so that step (c) successively adjusts a series of consecutive bits of the gain value beginning with adjustment of a more significant bit and ending with adjustment of a less significant bit.

The present invention also provides particular methods and apparatus for self calibration which are especially adapted for applicants' computation unit which computes polynomials of powers of the radix.

BRIEF DESCRIPTION OF THE DRAWINGS

Other objects and advantages of the invention will become apparent upon reading the following detailed description and upon reference to the drawings in which:

FIGS. 10A and 10B comprise a a block diagram of an analog-to-digital converter system including the redundant CR algorithmic converter and computation unit of FIG. 5 and digital self-calibration circuits in accordance with another aspect of the present invention;

Figure 1:
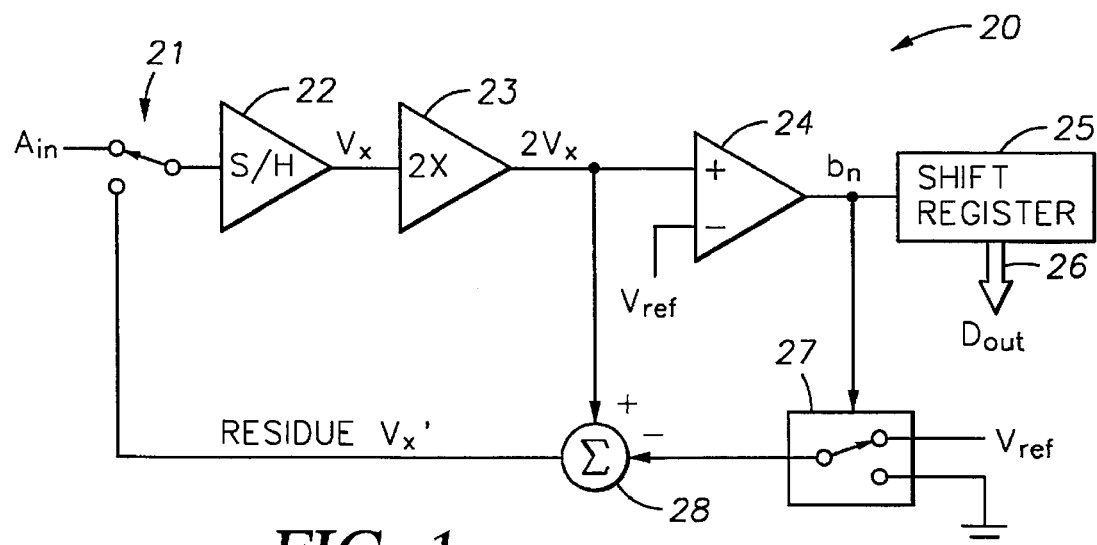
FIG. 1 is a schematic diagram of a prior-art conventional restoring (CR) algorithmic converter.

While the invention is susceptible to various modifications and alternative forms, specific embodiments thereof have been shown by way of example in the drawings and will be described in detail herein. It should be understood, however, that it is not intended to limit the invention to the particular forms disclosed, but on the contrary, the intention is to cover all modifications, equivalents, and alternatives falling within the scope of the invention as defined by the appended claims.

DETAILED DESCRIPTION OF THE PREFERRED EMBODIMENT

Turning now to FIG. 1, there is shown a schematic diagram of a prior-art conventional restoring (CR) algorithmic converter generally designated 20. To convert an analog input signal $A_{in}$ to a multi-bit digital output value $D_{out}$, the converter 20 is operated for N conversion cycles, where N is the number of bits in the digital output value $D_{out}$.

In a first conversion cycle, an analog switch 21 selects the analog input signal $A_{in}$ and provides the selected signal to a sample-and-hold 22. The sample-and-hold 22 provides a stable signal $V_x$ to an amplifier 23 for the remainder of the first cycle. The amplifier 23 has a gain of two, providing an output having a value of $2V_x$. The output of the amplifier 23 is provided to a comparator 24 that generates a binary signal $b_n$ indicating whether or not the output $2V_x$ of the amplifier is greater than a reference voltage $V_{ref}$ for the nth conversion cycle. The binary signal $b_0$ generated during the first cycle is the most significant bit (MSB) of the digital output value $D_{out}$, and the binary signal $b_{N-1}$ generated during the last cycle is the least significant bit (LSB) of the digital output value $D_{out}$. To provide the N bits representing the digital output value $D_{out}$ simultaneously to respective lines of a multi-line bus 26, the output of the comparator 24 is provided to a serial data input of a serial-to-parallel shift register 25 which is clocked at the end of each cycle.

For subsequent conversion cycles, the binary value $b_n$ from the comparator 24 operates an analog multiplexer 27 selecting either the reference voltage $V_{ref}$ when $b_n$ is a logic one indicating $2V_x$ is greater than $V_{ref}$, or ground when $b_n$ is a logic zero indicating $2V_x$ is not greater than $V_{ref}$. In this fashion, the analog multiplexer 27 operates as a two-level digital-to-analog converter (DAC). At a summing node 28, the voltage selected by the analog multiplexer 27 is subtracted from the output $2V_x$ of the amplifier 23 to produce a residue $V_x'$.

During subsequent conversion cycles, the analog multiplexer 21 selects the residue $V_x'$, and the residue $V_x'$ is sampled by the sample and hold 22. The sample and hold 22 prevents uncontrolled feedback in the conversion loop. The amplifier 23, comparator 24, shift register 25, analog multiplexer 27, and summing node 28 operate during each subsequent conversion cycle in the manner described above for the first conversion cycle. Therefore, after a total of N cycles, the shift register 25 becomes loaded with the binary values $b_n$ for n=0 to N−1 representing the voltage of the analog input signal $A_{in}$.

Figure 2:
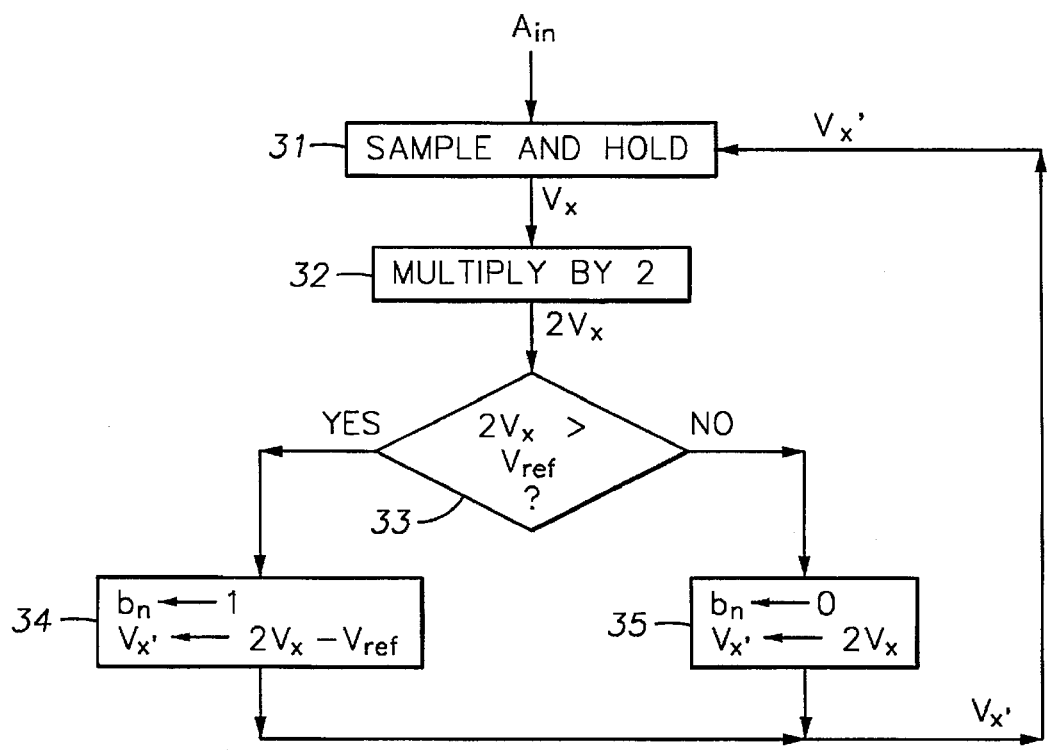
FIG. 2 is a flowchart of the prior-art CR cyclic conversion procedure used by the CR algorithmic converter of FIG. 1.

Turning now to FIG. 2, there is shown a flowchart that further illustrates the CR cyclic conversion procedure performed by the CR algorithmic converter of FIG. 1. In the first step 31, the sample and hold (22 in FIG. 1) initially samples the analog input signal $A_{in}$ to produce the signal $V_x$. Then in step 32, the amplifier (23 in FIG. 1) multiplies the signal $V_x$ by two to produce the signal $2V_x$. Next, in step 33, the procedure branches depending on whether or not the comparator (24 in FIG. 1) determines that the signal $2V_x$ is greater than the reference voltage $V_{ref}$. If so, then in step 34, the bit $b_n$ is set to one, and the residue $V_x'$ is produced by subtracting the reference voltage $V_{ref}$ from the signal $2V_x$. If not, then in step 35, the bit $b_n$ is set to zero, and the residue $V_x'$ is the signal $2V_x$. The procedure loops back to step 31 where the sample and hold (22 in FIG. 1) samples the residue $V_x'$ to produce the signal $V_x$.

In theory, so long as the residue $V_x'$ is bounded, the CR cyclic conversion procedure can loop any number of times to produce any desired resolution, or number of bits N, in the digital output signal $D_{out}$. For example, the signal $V_x(n)$ has the following values:

$$V_x(0) = A_{in}$$

$$V_x(1) = 2*A_{in} - b_0*V_{ref}$$

$$V_x(2) = 2*[2*A_{in} - b_0*V_{ref}] - b_1*V_{ref}$$

$$V_x(3) = 2*[2*[2*A_{in} - b_0*V_{ref}] - b_1*V_{ref}] - b_2*V_{ref}$$

$$V_x(n) = 2^n A_{in} - [2^{n-1}b_0 + 2^{n-2}b_1 + \ldots + b_{n-1}]*V_{ref}$$

All residues are considered bounded when $V_x(n) < V_{ref}$, so in this case:

$$A_{in}/V_{ref} - [2^{-1}b_0 + 2^{-2}b_1 + \ldots + 2^{-n}b_{n-1}] < 2^{-n}$$

and the digital output of the converter is:

$$D_{out} = 2^{-N}*[b_0 b_1 b_2 \ldots b_{N-1}]_2 = A_{in}/V_{ref}$$

The binary digits are seen to represent a binary fraction equal to $A_{in}/V_{ref}$. In other words, assuming that the "binary point" is just to the left of the most significant bit $b_0$, a full-scale input of $A_{in} = V_{ref}$ results in a value of 1.

In practice, the conventional CR cyclic conversion procedure is limited because gain and offset errors in the conversion loop affect the linearity of the converter. In order to have the linearity error below ½LSB, the offset and gain errors must be below ½LSB. In the presence of loop offset, the residues are no longer bounded as n increases. In order to keep the differential nonlinearity less than ½LSB, $V_{off}/V_{ref}$ must be less than $2^{-(n+1)}$.

To consider the effect of loop gain nonlinearity, suppose that the loop gain has a value of R which may be different from 2. In this case, $$V_x(n)=R*V_x(n-1)-b_{n-1}*V_{ref}$$

and the analog input is converted as:

$$A_{in}=[R^{-1}b_0+R^{-2}b_1+R^{-3}b_2+\ldots+R^{-N}b_{N-1}]*V_{ref}$$

Therefore the digital output $D_{out}$ is a number $[b_0 b_1 b_2 \ldots b_{N-1}]$ having N digits, but the radix of the numbering system is the loop gain R instead of 2. An error is introduced when the radix is assumed to be 2 when in fact the radix is not equal to 2:

$$|error| \leq |(2^{-1}+2^{-2}+\ldots+2^{-n})-(R^{-1}+R^{-2}+\ldots+R^{-N})|$$

Consequently, the loop gain must be N-bit accurate to avoid differential nonlinearity errors.

Figure 3:
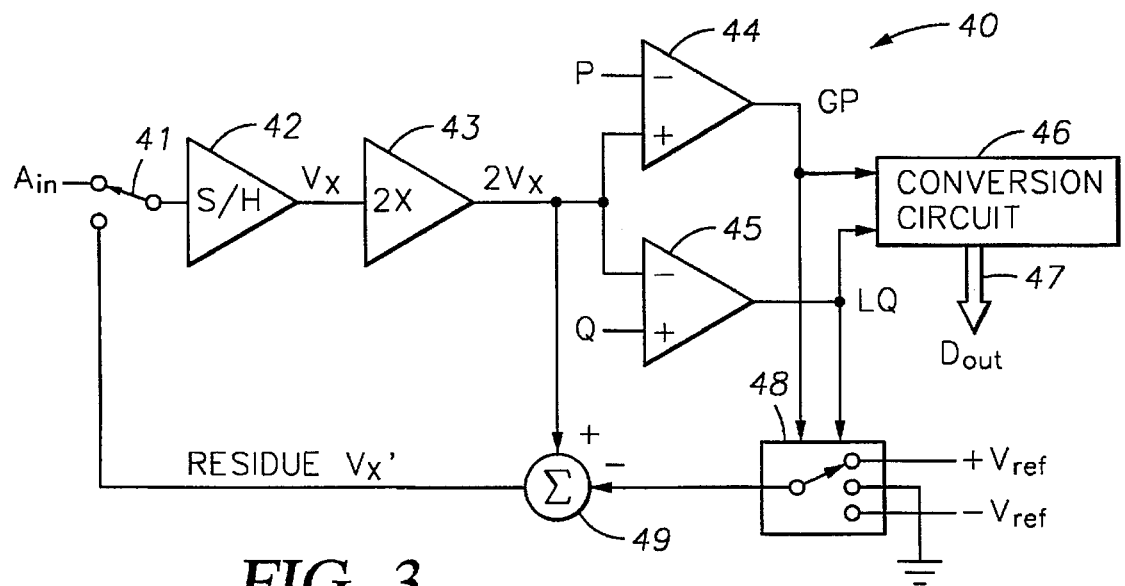
FIG. 3 is a schematic diagram of a prior-art redundant signed digit (RSD) algorithmic converter.

Turning now to FIG. 3, there is shown a schematic diagram of a prior-art redundant signed digit (RSD) algorithmic converter. As introduced above, the RSD algorithmic converter is insensitive to loop offset errors. To convert an analog input signal $A_{in}$ to a multi-bit digital output value $D_{out}$, the converter 40 is operated for N conversion cycles, where N is the number of bits in the digital output value $D_{out}$.

In a first conversion cycle, an analog switch 41 selects the analog input signal $A_{in}$ and provides the selected signal to a sample-and-hold 42. The sample-and-hold 42 provides a stable signal $V_x$ to an amplifier 43 for the remainder of the first cycle. The amplifier 43 has a gain of two, providing an output having a value of $2V_x$. The output of the amplifier 43 is provided to a first comparator 44 that generates a binary signal $GP_n$ indicating whether or not the output of the amplifier $2V_x$ is greater than a reference voltage P for the nth conversion cycle. The output of the amplifier 43 is also provided to a second comparator 45 that generates a binary signal $LQ_n$ indicating whether or not the output of the amplifier $2V_x$ is less than a reference voltage Q for the nth conversion cycle. The reference voltage P is greater than the reference voltage Q, so that $GP_n$ and $LQ_n$ are never simultaneously a logic one. The comparator levels P and Q are not critical. Values of $P=+\frac{1}{2}V_{ref}$ and $Q=-\frac{1}{2}V_{ref}$ provide for a maximum tolerable variation of loop offset of up to $\pm\frac{1}{4}V_{ref}$.

The binary signals $GP_n$ and $LQ_n$ define signed binary digits $b_n$ according to the following truth table:

| $GP_n$ | $LQ_n$ | $b_n$ | Residue |
|---|---|---|---|
| 0 | 0 | 0 | $V_x' = 2V_x$ |
| 0 | 1 | −1 | $V_x' = 2V_x + V_{ref}$ |
| 1 | 0 | +1 | $V_x' = 2V_x - V_{ref}$ |

The binary digits again are related to the analog input $V_{in}$ by the formula:

$$V_x(n)=2^n A_{in}-[2^{n-1}b_0+2^{n-2}b_1+\ldots+b_{n-1}]*V_{ref}$$

but for the RSD converter the series of digits $[b_0 b_1 b_2 \ldots b_{N-1}]$ does not form a conventional binary number representation because the bits are signed. More importantly, the series of digits comprise a redundant number representation because the number of digits is greater than the radix. For the RSD converter, the number of digits is 3, and the radix is 2. For example, the decimal number "25" could be represented by [1,1,1,−1,−1], or by [1,1,0,0,1], or by [1,1,0,1,−1].

To generate a conventional, non-redundant binary number $D_{out}$ on a multi-line bus 47, the RSD converter 40 has a conversion circuit 46. The conversion circuit has a series of D-type flip-flops (not shown) like a shift register but also has subtractor cells (not shown) between the flip-flops in order to subtract a value of one when $b_n=-1$. This kind of conversion circuit is not used in the present invention, and therefore it is not described here in further detail. The conversion circuit 46 is shown and further described in Ginetti et al., "A CMOS 13-b Cyclic RSD A/D Converter," IEEE Journal of Solid-State Circuits, Vol. 27, No. 7, July 1992, pp. 957–965, incorporated herein by reference.

For subsequent conversion cycles, the binary values $GP_n$ and $LQ_n$ operate an analog multiplexer 48 selecting either the reference voltage $+V_{ref}$ when $GP_n$ is a logic one indicating that $2V_x$ is greater than the level P, or ground when $GP_n$ is a logic zero and $LQ_n$ is a logic zero indicating that $2V_x$ is between the levels P and Q, or $-V_{ref}$ when $LQ_n$ is a logic one indicating that $2V_x$ is less than the level Q. In this fashion, the analog multiplexer 48 functions as a three-level digital-to-analog converter (DAC). At a summing node 49, the voltage selected by the analog multiplexer 48 is subtracted from the output $2V_x$ from the amplifier 23 to produce a residue $V_x'$.

During subsequent conversion cycles, the analog multiplexer 41 selects the residue $V_x'$, and the residue $V_x'$ is sampled by the sample and hold 42. The sample and hold 42 prevents uncontrolled feedback in the conversion loop. The amplifier 43, comparators 44 and 45, conversion circuit 46, analog multiplexer 48, and summing node 49 operate during each subsequent conversion cycle in the manner described above for the first conversion cycle.

Figure 4:
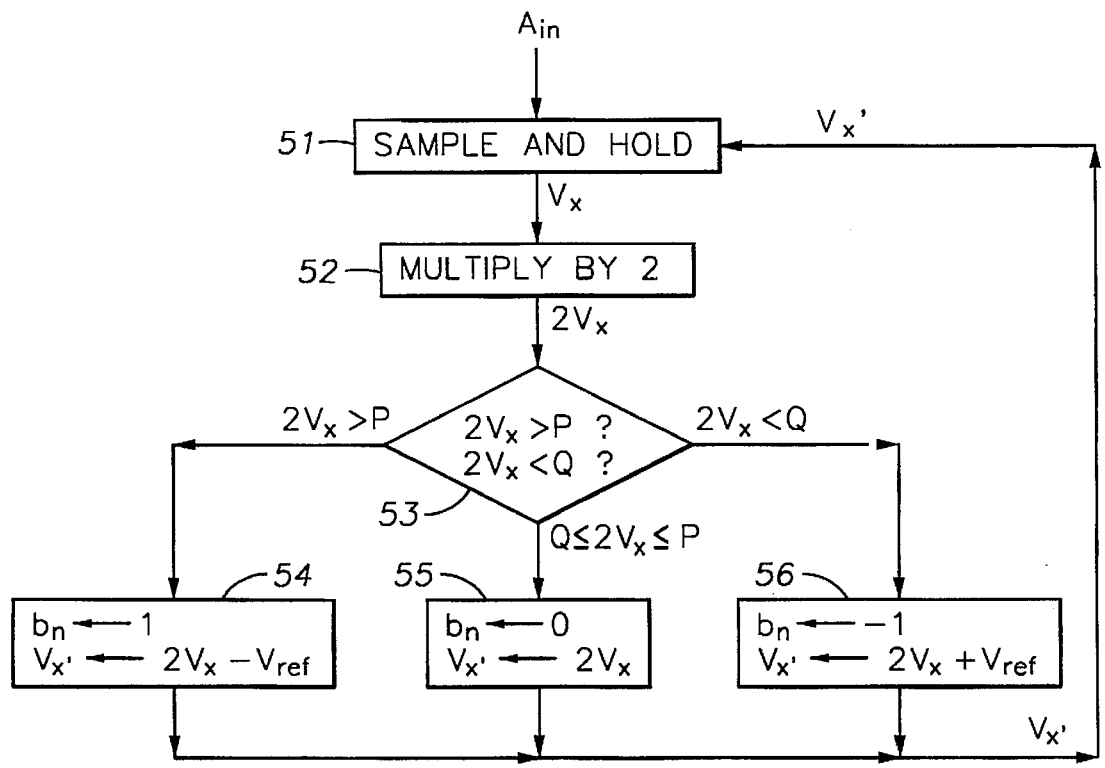
FIG. 4 is a flowchart of the prior-art RSD cyclic conversion procedure used by the RSD algorithmic converter of FIG. 3.

Turning now to FIG. 4, there is shown a flowchart that further illustrates the RSD cyclic conversion procedure performed by the RSD algorithmic converter of FIG. 3. In the first step 51, the sample and hold (42 in FIG. 3) initially samples the analog input signal $A_{in}$ to produce the signal $V_x$. Then in step 52, the amplifier (43 in FIG. 3) multiplies the signal $V_x$ by two to produce the signal $2V_x$. Next, in step 53, the procedure branches depending on whether or not the comparators (44 and 45 in FIG. 3) determine that the signal $2V_x$ is greater than the level P, between the levels P and Q, or is less than the level Q. If the signal $2V_x$ is greater than the level P, then in step 54, the digit $b_n$ is set to one, and the residue $V_x'$ is produced by subtracting the reference voltage $V_{ref}$ from the signal $2V_x$. If the signal $2V_x$ is between the levels P and Q, then in step 55 the digit $b_n$ is set to zero, and the residue $V_x'$ is the signal $2V_x$. If the signal $2V_x$ is less than the level Q, then in step 56, the digit $b_n$ is set to minus one, and the residue $V_x'$ is produced by adding the reference voltage $V_{ref}$ to the signal $2V_x$. The procedure loops back to step 51 where the sample and hold (42 in FIG. 3) samples the residue $V_x'$ to produce the signal $V_x$.

The RSD converter can be made insensitive to loop offsets by preventing the residues from diverging. As shown by Ginetti et al., cited above, loop offsets up to P/2 (assuming that Q=−P) do not induce nonlinearities in a RSD converter.

The RSD algorithmic converter 40 of FIG. 3 has the disadvantage that the linearity of the converter is sensitive to the symmetry of the $+V_{ref}$, 0, and $-V_{ref}$ voltage levels from the analog multiplexer 48. In contrast, the CR algorithmic converter 20 of FIG. 1 does not have this problem, because the analog multiplexer 27 in FIG. 1 provides only two voltage levels and therefore functions as an inherently linear DAC. The conventional CR algorithmic converter, however, is very sensitive to loop offsets. This problem is solved by a redundant CR algorithmic converter in accordance with the present invention that has a loop gain R less than two in order to prevent loop offsets in the converter from causing non-linearities.

Figure 5:
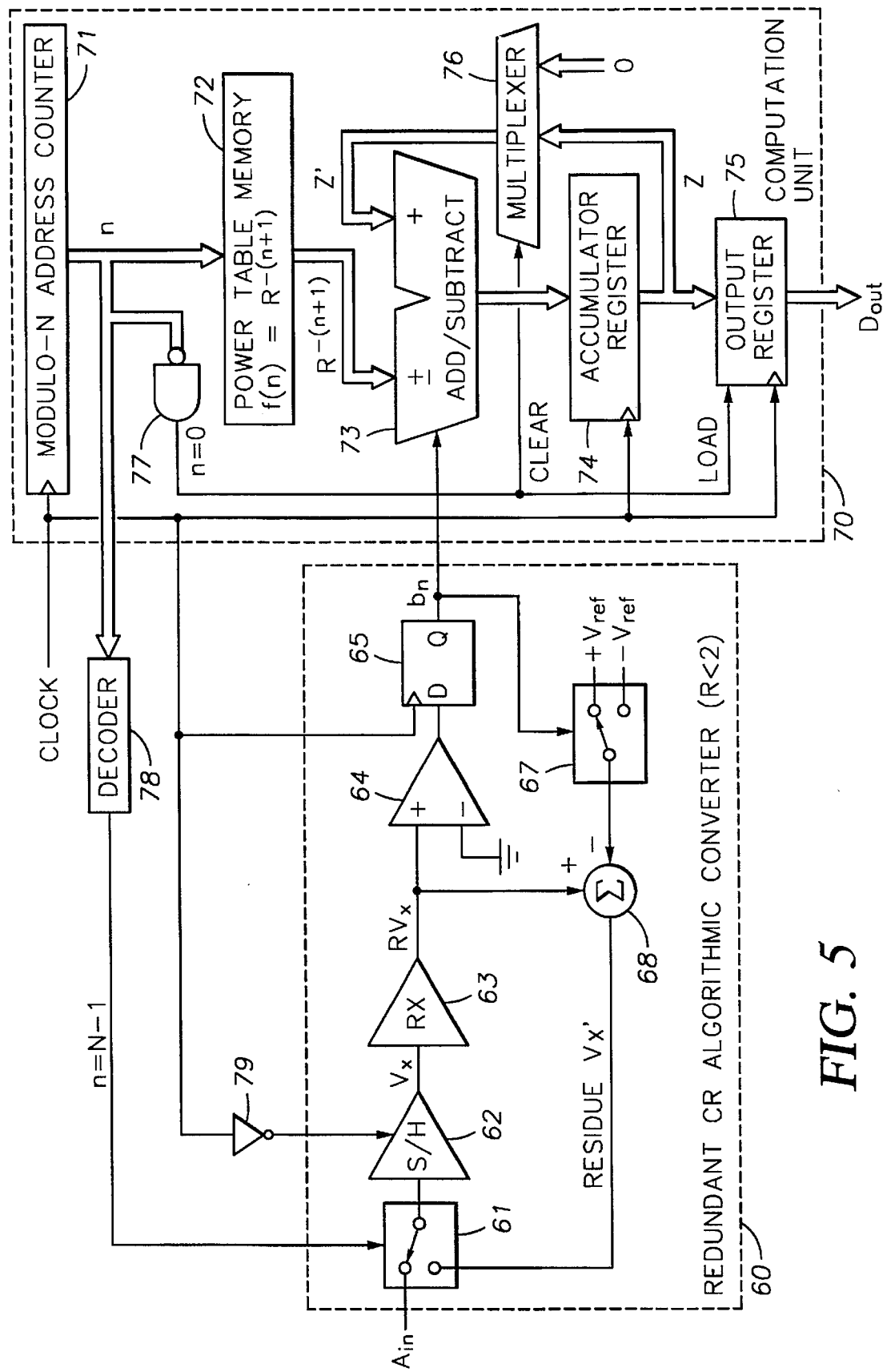
FIG. 5 is a schematic diagram of a redundant CR algorithmic converter using a loop gain of less than two and a digital computation unit for converting the redundant code output to binary code in accordance with the present invention.

Turning now to FIG. 5, there is shown a schematic diagram of the redundant CR algorithmic converter 60 using a loop gain R of less than two for converting an analog input signal $A_{in}$ to a redundant code $b_n$ and a computation unit 70 for converting the redundant code to a conventional binary code digital output $D_{out}$. The redundant CR algorithmic converter has an analog multiplexer 61, a sample and hold 62, an amplifier 63, a comparator 64, an analog multiplexer 67, and a summing node 68, which are similar to the similar components 21, 22, 23, 24, 27, and 28, respectively, shown and described above with reference to FIG. 1. A flip-flop 65 is also explicitly shown to illustrate the relative timing between the converter 60 and the computational unit 70. A latching comparator could be used in lieu of the combination of the comparator 64 and the flip-flop 65.

In contrast to the converter shown in FIG. 1, the amplifier 63 has a gain R which is significantly less than two, so that the loop gain of the converter 60 is significantly less than two. As further shown in FIG. 5, the comparator 64 compares the signal $RV_x$ from the amplifier 63 to an analog ground which should be close to the midpoint between $+V_{ref}$ and $-V_{ref}$, and the analog multiplexer 67 functions as a two-level DAC to select a first level at $+V_{ref}$ and a second level at $-V_{ref}$. Consequently, when the comparator 64 generates a logic high indicating that the signal $RV_x$ from the amplifier 63 is greater than the analog ground, the digit $b_n$ has a value of +1, and when the comparator 64 generates a logic low indicating that the signal $RV_x$ is less than the analog ground, the digit $b_n$ has a value of −1.

For an initial cycle of n=0, the signal $V_x=A_{in}$, and for subsequent cycles, $V_x(n)=R*V_x(n-1)-b_{n-1}*V_{ref}$. Consequently, after N cycles, the analog input is converted as:

$$A_{in}=[R^{-1}b_0+R^{-2}b_1+R^{-3}b_2+\ldots+R^{-N}b_{N-1}]*V_{ref}$$

Therefore the digital output $D_{out}$ is a number $[b_0b_1b_2\ldots b_{N-1}]$ having N digits, but the radix of the numbering system is the loop gain R instead of 2.

To convert the number $[b_0b_1b_2\ldots b_{N-1}]$ to the conventional binary code digital output $D_{out}$, the computational unit 70 has a modulo-N address counter providing a cycle index D that addresses a memory having stored in it a table of powers of the reciprocal of the radix. The computational unit 70 also has an adder/subtractor 73 and an accumulator register 74 for computing the binary value of the expression:

$$R^{-1}b_0+R^{-2}b_1+R^{-3}b_2+\ldots+R^{-N}b_{N-1}=D_{out}.$$

The adder/subtractor 73 is controlled by the output $b_n$ of the comparator 64 so that when $b_n$ is a logic high ($RV_x>0$) the adder/subtractor 73 adds $R^{-(n-1)}$, and when $b_n$ is a logic low ($RV_x<0$) the adder/subtractor subtracts $R^{-(n+1)}$.

At the end of the cycle when the cycle index n is equal to N−1, the value of $D_{out}$ is loaded into the accumulator register 74. Therefore, at the end of the next cycle when n=0, the value of $D_{out}$ is loaded into an output register 75. Also when n=0, a multiplexer 76 selects a value of zero instead of the value z of the accumulator register 74 to be fed back to the adder/subtractor 73, so that the accumulator is effectively cleared during the cycle when n=0. The control signal (CLEAR) for the multiplexer 76, and the load signal (LOAD) for the output register 75, is provided by a NOR gate 77 functioning as a decoder for the state n=0.

Because of delay through the converter 60, the analog multiplexer 61 selects the analog input $A_{in}$ when n=N−1, as detected by a decoder 78. As indicated by an inverter 79, the sample-and-hold 62 is strobed out-of-phase with respect to the clocking of the delay flip-flop 65.

The computation unit 70 may compute a digital output $D_{out}$ having a number of bits in excess of the conversion resolution, and in general it is desirable for the power table memory 72 and the accumulator register 74 to have a number of bits in excess of the converter resolution so as to suppress the accumulation of error due to the quantization of the radix powers $R^{-(n+1)}$.

Figure 6:
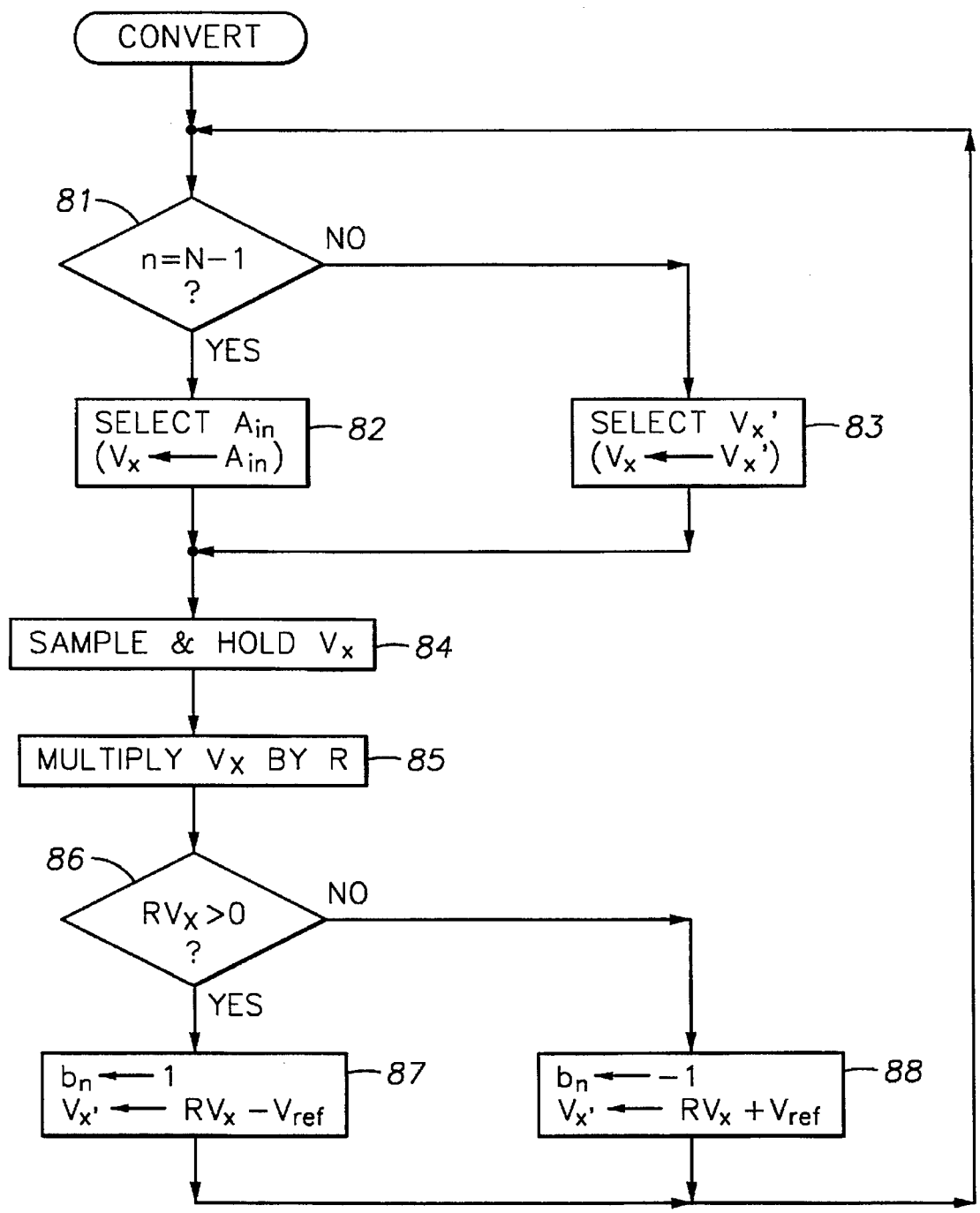
FIG. 6 is a flowchart of the conversion procedure used by the redundant cyclic converter in FIG. 5.

Turning now to FIG. 6, there is shown a flowchart of the conversion procedure used by the redundant CR algorithmic converter 60 in FIG. 5. In a first step 81 of FIG. 6, the procedure branches depending on whether or not the index n is equal to N−1. If so, then in step 82 the analog multiplexer 61 in FIG. 5 selects the analog input voltage $A_{in}$. Otherwise, in step 83, the analog multiplexer 61 selects the residue voltage $V_x'$. After steps 82 or 83, the procedure continues in step 84.

In step 84, the signal $V_x$ selected by the analog multiplexer 61 in FIG. 5 is sampled and held by the sample and hold 62 in FIG. 5. Then, in step 85, the amplifier 63 in FIG. 5 multiplies the selected signal $V_x$ by the loop gain R.

In step 86, the procedure branches depending on whether or not the comparator 64 in FIG. 5 finds that the output $RV_x$ of the amplifier 63 is greater than zero. If so, then in step 87, the digit $b_n$ is assigned a value of 1, and the analog multiplexer 67 and summing node 68 in FIG. 5 set the residue $V_x'$ to a voltage of $RV_x-V_{ref}$. Otherwise, in step 88, the digit $b_n$ is assigned a value of −1, and the analog multiplexer 67 and summing node 68 in FIG. 5 set the residue $V_x'$ to a voltage of $RV_x+V_{ref}$. After step 87 or 88, the procedure loops back to step 81.

Figure 7:
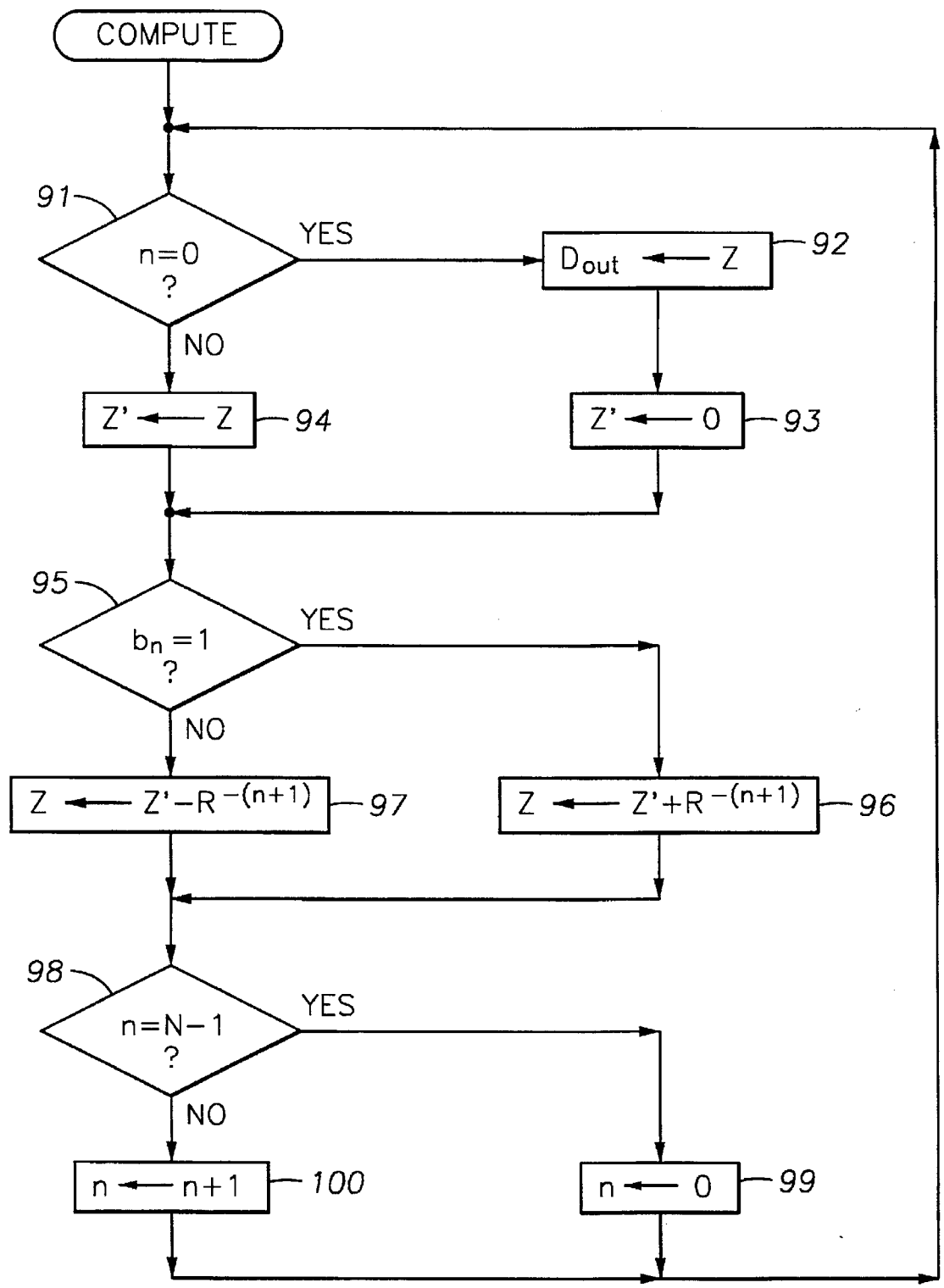
FIG. 7 is a flowchart of the computation procedure used by the computation unit in FIG. 5.

Turning now to FIG. 7, there is shown a flowchart of the computation procedure used by the computation unit 70 in FIG. 5. In a first step 91 in FIG. 7, execution branches depending on whether the cycle index n is zero. If so, then in step 92 the value of the digital output $D_{out}$ in the output register 75 in FIG. 5, is set to the value z in the accumulator register 74 of FIG. 5, and in step 93 the multiplexer 76 in FIG. 5 selects a value of zero for the input z' of the adder/subtractor 73 in FIG. 5. After steps 93 or 94, the procedure continues in step 95.

In step 95 the procedure branches depending on whether the digit $b_n$ has a value of 1. If so, then in step 96 the adder/subtractor 73 in FIG. 5 performs an addition operation to compute the sum $z=z'+R^{-(n+1)}$ which is loaded into the accumulator register 74 in FIG. 5. Otherwise, in step 97 the adder/subtractor 73 in FIG. 5 performs a subtraction operation to compute the difference $z=z'-R^{-(n+1)}$ which is loaded into the accumulator register 74 in FIG. 5. After steps 96 or 97, the procedure continues in step 98.

In step 98, the procedure branches depending on whether the cycle index n is equal to N−1. If so, then in step 99, the cycle index n is reset to zero. Otherwise, in step 100, the cycle index n is incremented by one. After steps 99 or 100, the procedure loops back to step 91.

Figure 8:
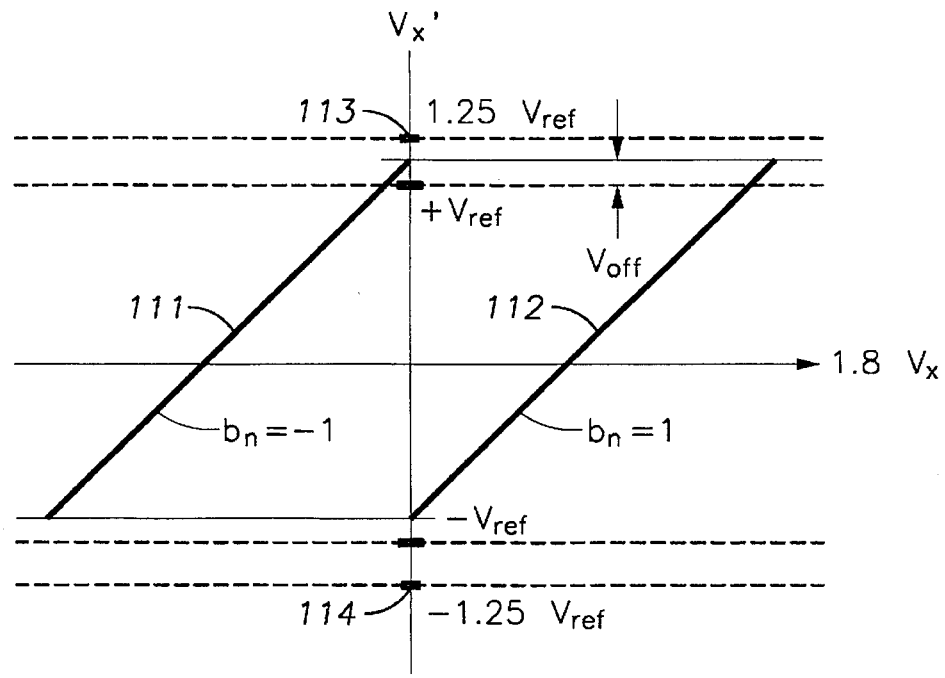
FIG. 8 is a Robertson diagram which represents graphically the loop transfer function of the redundant CR algorithmic converter in FIG. 5 when the radix has a value of 1.8.

Turning now to FIG. 8, there is shown a Robertson diagram which represents graphically the loop transfer function of the redundant CR algorithmic converter 60 in FIG. 5 when the loop gain or radix R has a value of 1.8. As seen in FIG. 8, the loop transfer function is discontinuous for an abscissa value of $V_x=0$. The loop transfer function includes a first segment 111 for which the digit $b_n$ has a value of $-1$, and a second segment 112 for which the digit $b_n$ has a value of $+1$. The abscissa is scaled by the radix value of 1.8 so that the slope of the transfer function has been normalized to one.

The loop gain R is chosen to be sufficiently less than two so that there is always a safety margin to prevent possible offsets from causing non-linearities in the conversion. Non-linearities are caused when the residues diverge. Given any particular offset voltage $V_{off}$, diverging residues can always be avoided by picking the loop gain R to be sufficiently less than 2 as follows:

$$R<2/(1+|V_{off}|/V_{ref}).$$

This expression can be rearranged to:

$$|V_{off}|<(2-R)/RV_{ref}$$

or further rearranged to:

$$|V_{off}|(R+1)+(R-1)V_{ref}<V_{ref}+|V_{off}|.$$

This last form can be used to show that residue divergence is avoided with all residues bounded by:

$$|V_x'(n)|\leq V_{xmax}\equiv V_{ref}+|V_{off}|.$$

This bound can be seen by considering the iteration expression for the converter:

$$V_x'(n+1)=RV_x'(n)+V_{off}-b_nV_{ref}$$

Setting $V_x'(n)=V_{xmax}$, $$V_x'(n+1)=RV_{xmax}+V_{off}-V_{ref}$$

$$V_x'(n+1)=RV_{ref}+R|V_{off}|+V_{off}-V_{ref}$$

$$V_x'(n+1)=(R-1)V_{ref}+R|V_{off}|+V_{off}$$

$$|V_x'(n+1)|\leq(R-1)V_{ref}+(R+1)|V_{off}|$$

$$|V_x'(n+1)|<V_{ref}+|V_{off}|=V_{xmax}$$

where the last step makes use of the previously-noted relationship between offset and loop gain. A similar result can be found for $V_x'(n)=-V_{xmax}$. Note that these relationships can be manipulated to show that the residues are bounded by:

$$|V_x(n)|\leq\frac{2V_{ref}}{R}$$

FIG. 8 graphically illustrates how excessive offset can lead to diverging residues. For a loop gain R of 1.8, divergence would occur when a positive offset $V_{off}$ would cause an upper portion of the transfer characteristic 111, 112 to shift above a mid-level between $+V_{ref}$ and the level 113 at $+V_{ref}/(R-1)=+1.25*V_{ref}$ so that $V_x'(n)$ would be greater than $(V_{ref}-V_{off})/(R-1)$. Divergence would also occur when a negative offset $-V_{off}$ would cause a lower portion of the transfer characteristic 111, 112 to shift below a mid-level between $-V_{ref}$ and the level 114 at $-V_{ref}/(R-1)=-1.25*V_{ref}$ so that $V_x'(n)$ would be less than $(-V_{ref}+V_{off})/(R-1)$.

Preferably, the loop gain R is not much smaller than necessary because the conversion rate decreases with decreased loop gain as the output codes become increasingly redundant with decreased loop gain. For a digital output $D_{out}$ having a conversion resolution of 7 bits, the redundant CR algorithmic converter must produce $2^q$ unique output codes. Therefore:

$$R^{N-1}+R^{N-2}+R^{N-3}+\ldots+R+1>2^q$$

For a 12 bit converter, with a radix of 1.75, N must be greater than 14. For a typical analog CMOS process, a good value for R would be about 1.75.

To summarize, an algorithmic converter that produces redundant codes has been shown to be insensitive to loop offsets. For both the RSD converter and for a converter having a loop gain of radix R less than two, the loop offset translates into an input referred offset. The redundant CR algorithmic converter has an advantage over the RSD converter because the redundant CR algorithmic converter needs only two feedback voltage levels, and the two feedback levels are inherently linear.

Although the redundant CR algorithmic converter 60 of FIG. 5 is tolerant of loop offset errors, any miss-match between the loop gain $R_a$ of the redundant CR algorithmic converter 60 and the radix $R_d$ of the computational unit 70 results in differential non-linearities:

$$|\text{error}|\leq|(R_a^{-1}+R_a^{-2}+\ldots+R_a^{-n})-(R_d^{-1}+R_d^{-2}+\ldots+R_d^{-n})|$$

Consequently, the loop gain of the algorithmic converter must match the radix of the computational unit to the desired level of accuracy of the converter to avoid differential nonlinearity errors. Such a match could be obtained by trimming the gain of the amplifier 63 to match a predetermined value for the radix R of the computation unit. In accordance with the present invention, however, a value for the radix R of the computational unit is determined by a digital self-calibration procedure in such a way as to match the actual value of the loop gain of the algorithmic converter. This digital self-calibration procedure also compensates for the loop offset, so that an analog input $A_{in}$ at zero volts (analog ground) results in a digital output $D_{out}$ of zero, and calibrates the gain of the converter, so that an analog input $A_{in}$ at $+V_{ref}$ results in a digital output of positive full scale.

In a specific embodiment of the invention, the digital self-calibration procedure measures the loop gain R of the algorithmic converter by conversion of two known analog input values, which will be designated as $A_0$ and $A_1$, resulting in two code sequences $b_n'$ and $b_n''$. Each known analog input value is a polynomial function of the reciprocal of the loop gain. Each polynomial function has the same constant coefficient, which is the input-referred offset $O_i$:

$$A_0/V_{ref}=O_i+b_0'R^{-1}+b_1'R^{-2}+b_2'R^{-3}+\ldots+b_{N-1}'R^{-N}$$

$$A_1/V_{ref}=O_i+b_0''R^{-1}+b_1''R^{-2}+b_2''R^{-3}+\ldots+b_{N-1}''R^{-N}$$

To determine the loop gain R, these two polynomial equations can be subtracted from each other to obtained a single polynomial equation $0=f(R^{-1})$ in which the reciprocal of the loop gain is the only unknown:

$$0=(A_1-A_0)/V_{ref}+(b_0'-b_0'')R^{-1}+(b_1'-b_1'')R^{-2}+\ldots+(b_{N-1}'-b_{N-1}'')R^{-N}$$

where the expression on the right-hand side of the above polynomial equation is defined as $f(R^{-1})$. This single polynomial equation may have more than one real root. With knowledge that the actual loop gain of the algorithmic converter is within some sufficiently narrow range, however, the desired root can be found with precision so long as the known analog inputs $A_0$ and $A_1$ are sufficiently spaced apart. A general numerical technique could be used for finding the root of the polynomial equation, such as Newton's method. For example, if the loop gain has a nominal value of $R_0$, then this nominal value could be used as a trial solution to compute a better solution by the iterative equation of Newton's method. The reciprocal of the radix will be computed to a sufficiently high precision after a few iterations.

In accordance with a further aspect of the present invention, the radix is determined by a successive approximation technique that requires much less hardware and control logic than Newton's method. Newton's method, for example, could be performed using a programmed microprocessor. In contrast, the successive approximation technique of the present invention does not require a microprocessor, nor does it require memory for storing together the digits from the conversions of two separate known analog input values. Instead, a procedure is used in which the known analog input value $A_0$ is converted to an approximate corresponding digital output value $D_0$ assuming a nominal value for $R^{-1}$, and then the known analog input value $A_1$ is converted to a series of digits $b_0''$ to $b_{N-1}''$ and a successive approximation technique is used to determine a better estimate of the radix R. In particular, one method computes an estimate $\hat{O}_i$ of the input-referred offset from an estimate $\hat{R}_i$ of the radix R according to:

$$\hat{O}_i = A_0/V_{ref} - (b_0'\hat{R}_i^{-1} + b_1'\hat{R}_i^{-2} + \ldots + b_{N-1}'\hat{R}_i^{-N})$$

and then the method uses a successive approximation technique to solve the following polynomial equation:

$$0 = -A_1/V_{ref} + \hat{O}_i + b_0''R^{-1} + b_1''R^{-2} + \ldots + b_{N-1}''R^{-N}$$

These two steps are repeated a sufficient number of times to obtain a very precise value for the reciprocal of the radix that corresponds to the loop gain of the converter.

The preferred calibration method computes an estimate $\hat{O}_i$ of the input-referred offset from an estimate $\hat{R}_i$ of the radix R according to:

$$\hat{O}_i + A_0/V_{ref} - (b_o'\hat{R}_i^{-1} + b_1'\hat{R}_i^{-2} + \ldots + b_{N-1}'\hat{R}_i^{-N})$$

and then the preferred method evaluates the following polynomial equation:

$$x = \hat{O}_i + b_o''\hat{R}_i^{-1} + b_1''\hat{R}_i^{-2} + \ldots + b_{N-1}''\hat{R}_i^{-N}$$

and compares the result x to the reference value $A_1/V_{ref}$ to determine the next gain estimate $\hat{R}_{i+1}$. These two steps are repeated, successively adjusting a series of consecutive bits of the gain value, beginning with adjustment of a more significant bit, and ending with adjustment of a less significant bit.

For using any successive approximation technique for calibrating the radix for the RSD converter 40 of FIG. 3, the known analog input $V_0$ is preferably zero (analog ground), and the known voltage $V_1$ can be $+V_{ref}$ or $-V_{ref}$. For using any successive approximation technique for calibrating the radix for the redundant CR algorithmic converter 60 of FIG. 5, however, the known analog inputs $V_1$ and $V_0$ are preferably $+V_{ref}$ and $-V_{ref}$. If a successive approximation technique were used for calibrating the radix of the redundant CR algorithmic converter 60 of FIG. 5 using a known analog input of zero, there would be convergence difficulties because then the polynomial function $f(R^{-1})$ would have a second root closely spaced from the desired root.

Figure 9:
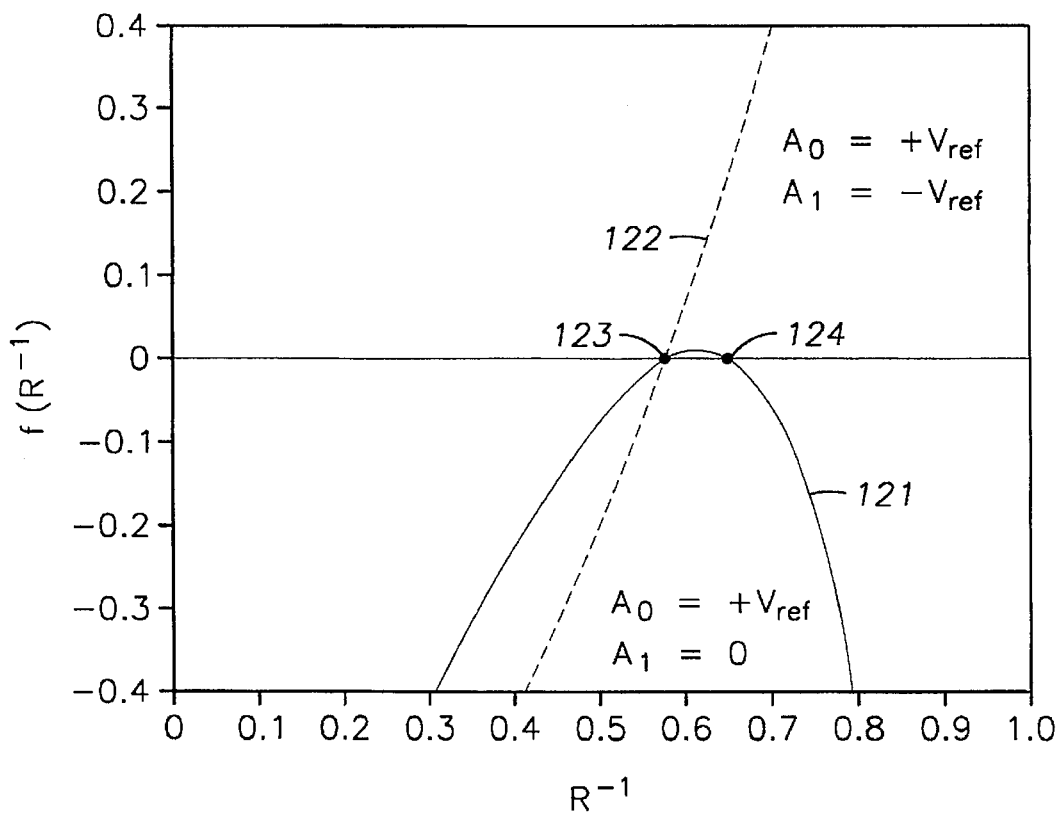
FIG. 9 is a graph of two polynomial functions each having a desired root which is the reciprocal of the measured loop gain of the redundant CR algorithmic converter of FIG. 5, and one of the functions having an undesired root which may cause convergence problems when a successive approximation method is used in an attempt to locate the desired root.

Shown in FIG. 9 is a graph 121 of the polynomial function $f(R^{-1})$ plotted for a first case of calibrating the redundant CR algorithmic converter 60 of FIG. 5 using $A_0 = 0$ and $A_1 = +V_{ref}$, and a graph of 122 of the polynomial function $f(R^{-1})$ plotted for a second case of calibrating the redundant CR algorithmic converter 60 of FIG. 5 using $A_0 = -V_{ref}$ and $A_1 = +V_{ref}$. In this example, the loop gain is 1.732421, the offset is $-3.089525 \times 10^{-2} V_{ref}$, and N=18 digits. The graph 121 shows that the polynomial function $f(R^{-1})$ for the first case is ill-behaved in the region of the desired root 123, because there is a second root 124 at $R^{-1} = 0.648$ that is very close to the desired root at $R^{-1} = 0.577227$. The presence of this second root 124 so close to the desired root 123 would cause convergence problems if the successive approximation technique were used in this first case. The graph 122 shows that the polynomial function $f(R^{-1})$ for the second case is well-behaved in the region of the desired root, because no other roots are close to the desired root. Consequently, the successive approximation technique may be used in the second case.

Figure 10B:
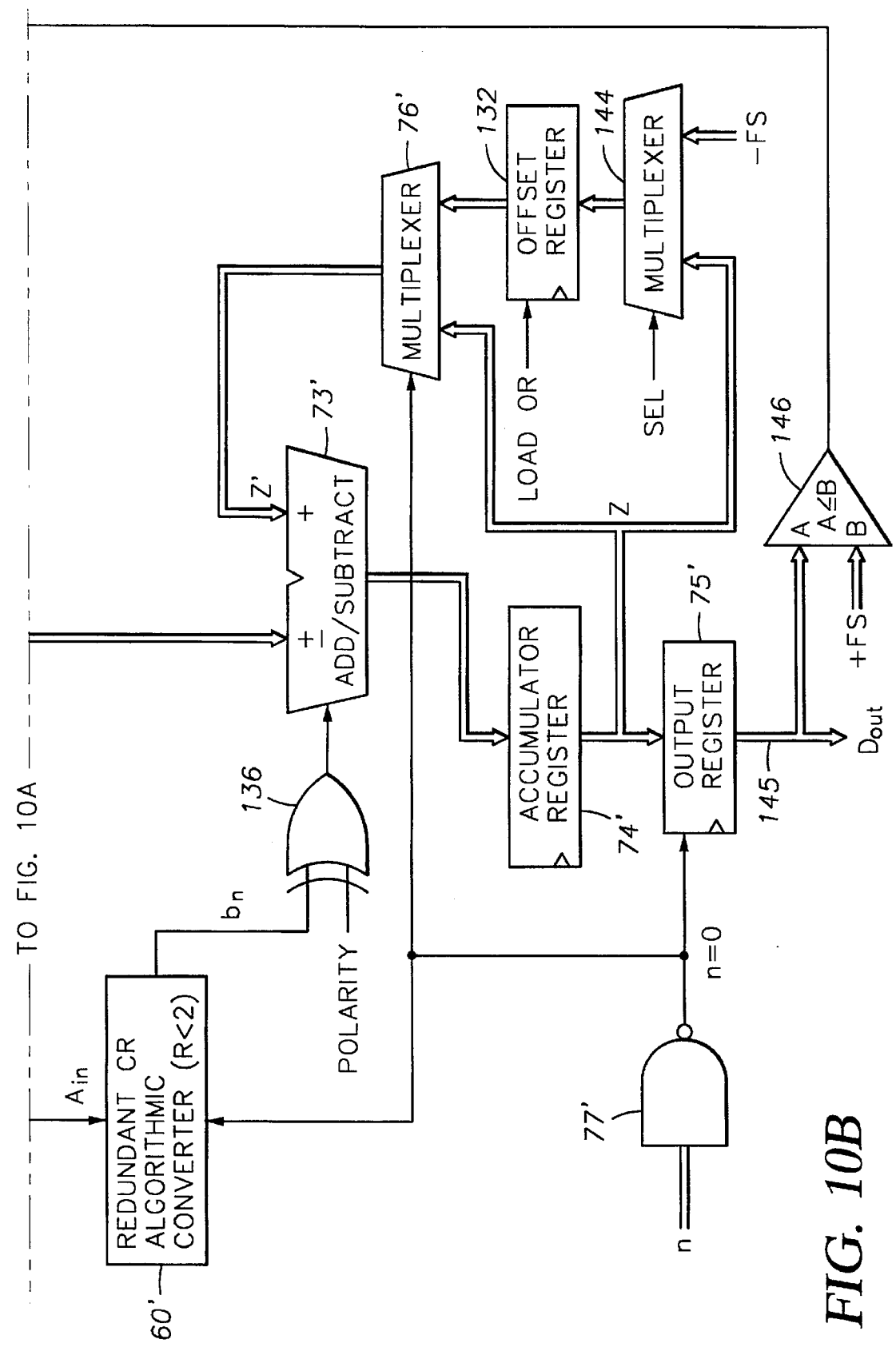

Turning now to FIGS. 10A and 10B, there is shown a block diagram of an analog-to-digital converter system including digital self-calibration circuits for performing the preferred successive approximation technique upon a redundant CR algorithmic converter 60'. Components in FIGS. 10A and 10B that are similar to components in FIG. 5 are designated with similar but primed reference numerals. The objective of the self-calibration circuits is to determine the reciprocal of the loop gain of the converter 60', and to determine the loop offset of the converter. During the calibration procedure, the reciprocal of the loop gain becomes stored in a radix register 131 (FIG. 10A), and the additive inverse of the loop offset becomes stored in an offset register 132. The reciprocal of the loop gain is passed to a multiplier 133 which operates in conjunction with a multiplexer 134 and a power register 135 to compute the powers of the reciprocal of R, and the powers are stored in the power table memory 72'. The multiplexer 134 initially selects a value of 1 so that the reciprocal of R becomes multiplied by 1 and passes through the multiplier 133 to the power register 135 and passes to the power table memory 72' so that the first entry stored in the power table memory 72' is the reciprocal of R. The multiplier 133 successively computes higher powers of the reciprocal of R when the multiplexer 134 selects the output of the power register 135 to be multiplied by the reciprocal of R from the radix register 131.

The multiplier 133 in FIG. 10A requires a number of clock cycles in order to perform a single multiplication. If the multiplier 133 could perform a multiplication in a single clock cycle, then there would be no need for the power table memory 72'. Without the power table memory 72, such a fast multiplier would have to operate continuously during the normal conversion mode, and consume a good deal of power. In contrast, the multiplier 133 in FIG. 10A can be a conventional multiplier incorporating a shift register, adder, and accumulator, which is relatively small in comparison to a fast, parallel multiplier which would use a large number of adder cells.

For performing the preferred successive approximation method, the converter system in FIG. 10A includes a calibration controller 140, which enters a calibration sequence in response to a calibrate signal on an input control line 141. In response, the calibration controller 140 switches from a normal mode of operation to a calibration mode. The calibration controller 140 preferably is a sequential state machine although alternatively it could be a microcontroller or microprocessor. The calibration controller 140 is the source of numerous control signals 142 which control the various counters, registers and multiplexers in FIGS. 10A and 10B. For example, one of the control signals operates an analog multiplexer 143 which selects an analog input signal $A_{in}'$ of the converter system during the normal mode of operation, and passes the selected analog signal to the analog input $A_{in}$ of the redundant CR algorithmic converter 60'. During the calibration mode, however, the calibration controller 140 controls the multiplexer 143 to select either a positive or negative polarity of the reference voltage $V_{ref}$.

The self-calibration circuits in FIG. 10B further include a multiplexer 144 for initially loading the offset register 132 with a digital value of negative full scale (−FS) corresponding to the analog voltage level $-V_{ref}$ selected by the analog multiplexer 143. During successive iterations of the successive approximation method, the multiplexer 144 selects the digital output of the accumulator register 74' for loading the offset register 132 at appropriate times. The value loaded into the offset register 132 is the additive inverse of the estimate of the loop offset of the converter 60. For the example of FIG. 10B, the additive inverse is obtained by asserting a polarity signal to an exclusive-OR gate 136 to reverse the polarity of the adder/subtractor 73' when computing the estimate of the loop offset. An alternative method of obtaining an additive inverse of the estimate of the loop offset is described below with reference to FIGS. 18A and 18B.

The radix register 131 is a successive-approximation type register having a number M of individually addressable bit positions. A clear_RR control signal clears the entire radix register. The bit address counter 148 points to a particular bit position of the radix register. The bit address counter 148 receives a LOAD_BAC signal for loading an initial value pointing to the most significant bit of the radix register, and a DEC control signal for decrementing the pointer.

For adjustment of the reciprocal of R, a numerical comparator 146 generates a signal that is a logic one when the digital output $D_{out}$ is less than or equal to a positive full scale value (+FS) corresponding to the voltage $+V_{ref}$ selected by the analog multiplexer 143; otherwise, the numerical comparator has an output that is a logic zero. A multiplexer 147 is used for initially setting the addressed bit in the radix register 131. Based on the signal from the numerical comparator 146, the addressed bit is selectively cleared when the digital output $D_{out}$ exceeds the positive full scale value.

Figure 11A:
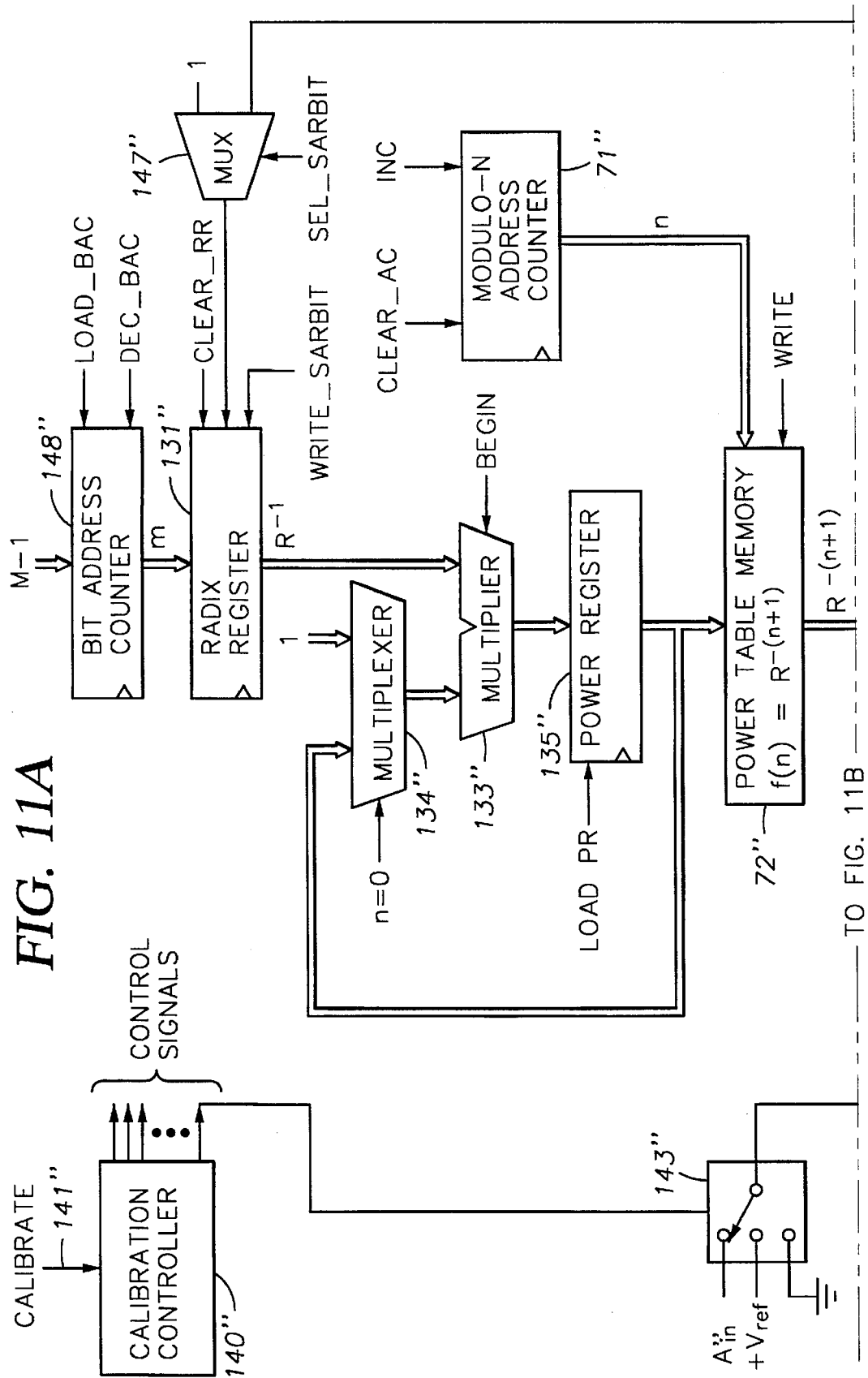
FIGS. 11A and 11B comprise a a block diagram of an analog-to-digital converter system including an RSD algorithmic converter of FIG. 3 and digital self-calibration circuits in accordance with yet another aspect of the present invention.
Figure 11B:
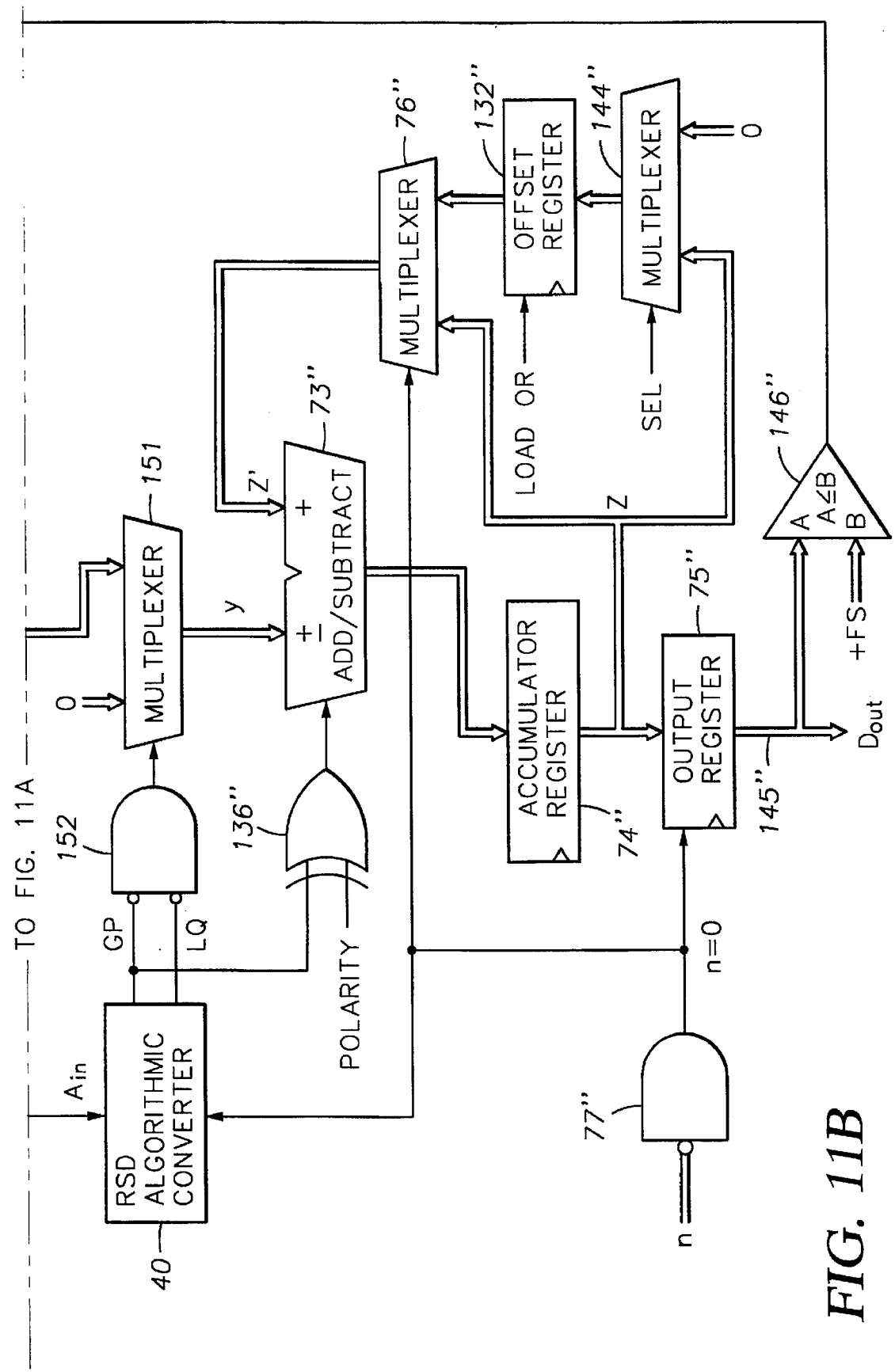

Turning now to FIGS. 11A and 11B, there is shown a block diagram of an analog-to-digital converter system including the RSD algorithmic converter 40 of FIG. 3 and suitable computation and digital self-calibration circuits for performing the preferred successive approximation method. The RSD algorithmic converter 40, however, should have a loop gain substantially less than two so that the RSD converter is tolerant of loop offset for the case of $A_{in}$ equal to $+V_{ref}$ and 0 as used during calibration as further described below.

Components in FIGS. 11A and 11B which are similar to components in FIGS. 10A and 10B are designated with similar but double-primed reference numerals. The computation circuits for the RSD algorithmic converter 40 include a multiplexer 151 (FIG. 11B) for selecting either the radix power $R^{-(n+1)}$, or a value of zero, and the selected value y is passed to the adder/subtractor 73". A NOR gate 152 controls the multiplexer 151 so that the multiplexer selects the value of zero when both the GP signal and the LQ signal from the converter 40 are a logic low. In other words, the adder/subtractor 73" adds a value of zero to the content of accumulator register 74" when both the GP and LQ control signals are a logic low, which occurs when the output $2V_x$ from the amplifier 43 in FIG. 3 falls between the P and Q levels.

During calibration of the RSD algorithmic converter 40, the calibration controller 140" (FIG. 11A) operates the analog multiplexer 143" to select either $+V_{ref}$ or ground. The digital multiplexer 144" selects either the value z from the accumulator register 74", or a value of zero. The numerical comparator 146" compares the digital output $D_{out}$ on the output bus 145" to a positive full scale value (+FS) corresponding to $+V_{ref}$ selected by the analog multiplexer 143".

Figure 12:
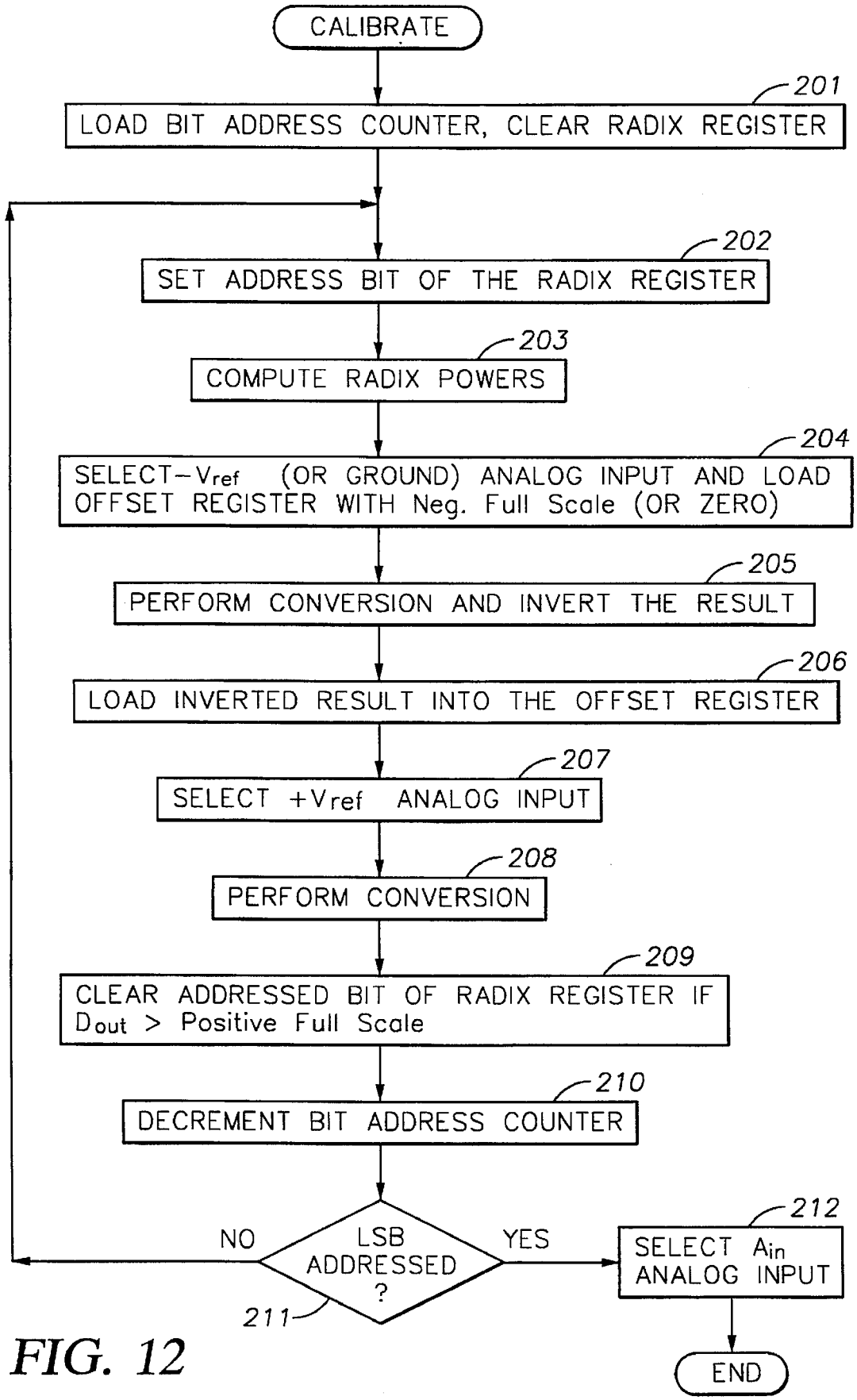
FIG. 12 is a flowchart of a successive approximation procedure for calibrating the redundant CR algorithmic converter in the system of FIGS. 10A and 10B or the RSD algorithmic converter in the system of FIGS. 11A and 11B.

Turning now to FIG. 12, there is shown a flowchart of the preferred successive approximation procedure for calibrating the redundant CR algorithmic converter in the system of FIGS. 10A and 10B or the RSD algorithmic converter in the system of FIGS. 11A and 11B. In the first step 201, the bit address counter (148 in FIG. 10A) is loaded to initially point to the most significant bit of the radix register (131 in FIG. 10A), and the radix register is cleared. In step 202 the addressed bit of the radix register is set; at this point, the radix register has a normalized value of $R^{-1}=½$. In step 203 the radix powers are computed from the value in the radix register, and the powers are stored in the power table memory (72' in FIG. 10A).

In step 204, for calibrating the redundant CR algorithmic converter of FIGS. 10A and 10B, the analog input multiplexer (143 in FIGS. 10A) selects the $-V_{ref}$ input, and the offset register (132 in FIG. 10B) is loaded with the negative full scale value (SEL selects −FS and the LOAD OR signal is asserted). (For calibrating the RSD algorithmic converter of FIGS. 11A and 11B, the analog input multiplexer 143" in FIG. 11B selects the analog ground input, and the offset register 132" is initially loaded with a value of 0.) In step 205, the algorithmic converter and the computational unit are operated to perform a conversion and to invert the result. In the circuits of FIGS. 10A, 10B and 11A and 11B, the result is inverted in response to the POLARITY signal. In step 205, the inverted result is loaded into the offset register (132 in FIG. 10B). Therefore, the offset register is loaded with the additive inverse of an estimate of the input-referred loop offset of the algorithmic converter.

In step 207, the analog input multiplexer (143 in FIG. 10A) selects the $+V_{ref}$ input. In step 208, a conversion is performed. In step 209, the addressed bit of the radix register is cleared if the digital output $D_{out}$ is greater than positive full scale (+FS). In step 210, the bit address counter is decremented.

In step 211, the procedure branches depending on whether or not the LSB of the of the radix register is being addressed by the bit address counter. If not, the procedure branches back to step 202; otherwise, the procedure continues to step 212. In step 212, the analog input multiplexer (143 in FIG. 10A) selects $A_{in}$, in order to operate the algorithmic converter in its normal conversion mode. At this point, the calibration procedure is finished.

Figure 13:
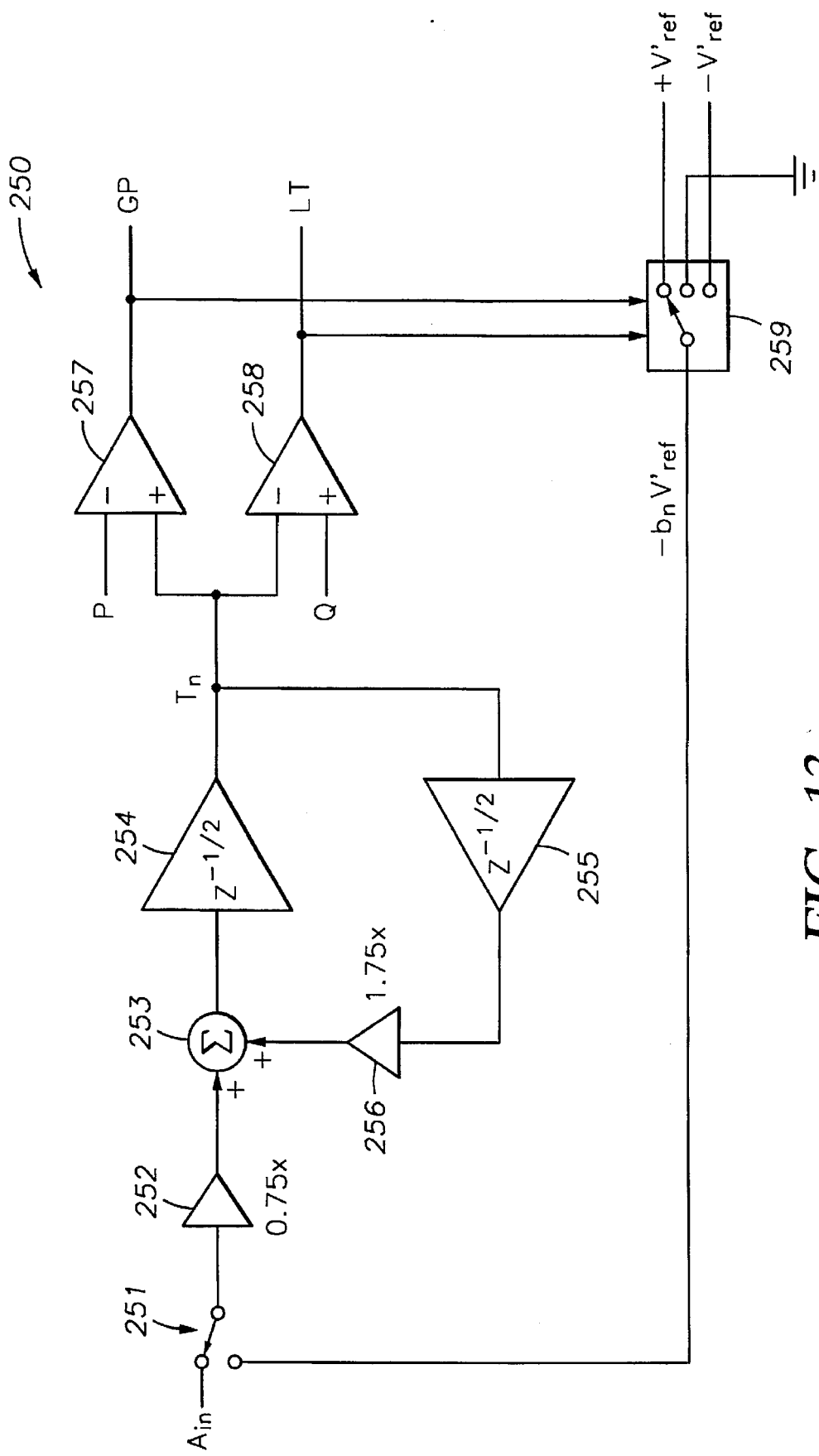
FIG. 13 is a block diagram of a specific embodiment of an RSD algorithmic converter having a loop gain less than 2.

Turning now to FIG. 13, there is shown a block diagram of a specific embodiment 250 of an RSD algorithmic converter having a loop gain less than 2. This embodiment is intended for implementation in analog CMOS using a 2.7 volt power supply. The actual circuit, as will be described with reference to FIGS. 14A and 14B, has a balanced, differential architecture. Such a converter may have 12 bits of resolution, a conversion rate of 51.2 kHz, an integral nonlinearity of about 1 LSB's, a differential nonlinearity of less than 1 LSB, and a power consumption of about 13 milliwatts (4 mA at 2.7 volts). These specifications are sufficient for a wide range of applications, such as converting analog signals from a digitizing tablet in a personal data assistant microcomputer as described in Maeda et al. U.S. Pat. No. 5,008,854 incorporated herein by reference, Hashimoto et al., U.S. Pat. No. 5,327,163 incorporated herein by reference, and Donald A. Kerth and Brian D. Green, U.S. patent application Ser. No. 08/373,009 filed concurrently herewith on Jan. 17, 1995 (Attorney Docket CRYS:023), entitled "Drive Current Calibration for an Analog Resistive Touch Screen," incorporated herein by reference.

As shown in FIG. 13, the converter includes an analog multiplexer 251 for selecting either an analog input signal $A_{in}$ or a feedback voltage $-b_n V'_{ref}$. A switched capacitor circuit 252 scales the selected signal by a factor of 0.75 and applies the scaled signal to a summing node 253. The signal from the summing node 253 passes through an amplifier 254 to provide in effect no additional gain and a delay of one-half of a clock cycle to produce a signal $T_n$. The signal $T_n$ is fed back through another amplifier 255 and a switched capacitor circuit 256 connected to the summing node 253 to provide another delay of one-half of a clock cycle and a loop gain of 1.75. The signal $T_n$ is also applied to comparators 257 and 258.

The comparator 257 compares the signal $T_n$ to a reference voltage P to generate a logic signal GP when $T_n$ is greater than P, and the comparator 258 compares the signal $T_n$ to a reference voltage Q to generate a logic signal LQ when $T_n$ is less than Q. The level P is about one-fifth of $V'_{ref}$ and the level Q is about one-fifth of $-V'_{ref}$. The logic signals GP and LQ control an analog multiplexer 259 functioning as a three-level DAC providing the feedback voltage $-b_n V'_{ref}$. When GP is a logic one ($T_n$>P), the analog multiplexer 259 selects $-V'_{ref}$. When LQ is a logic one ($T_n$<Q), the analog multiplexer 259 selects $+V'_{ref}$. Otherwise, when both GP and LQ are a logic zero, the analog multiplexer 259 selects an analog ground which is as close as possible to the midpoint between $+V'_{ref}$ and $-V'_{ref}$.

Figure 14A:
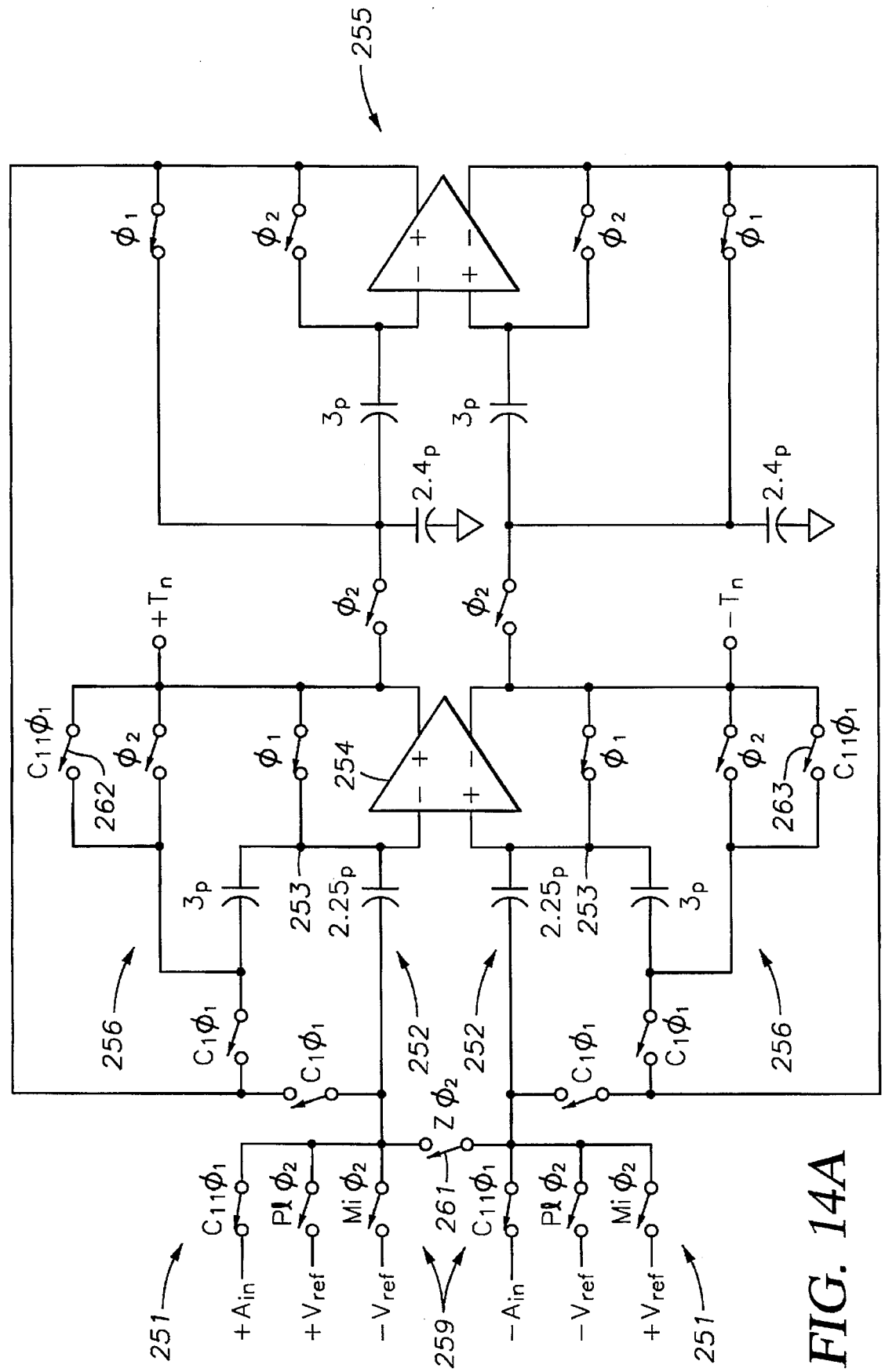
FIG. 14A is a schematic diagram of analog circuits in the RSD algorithmic converter of FIG. 13.
Figure 15:
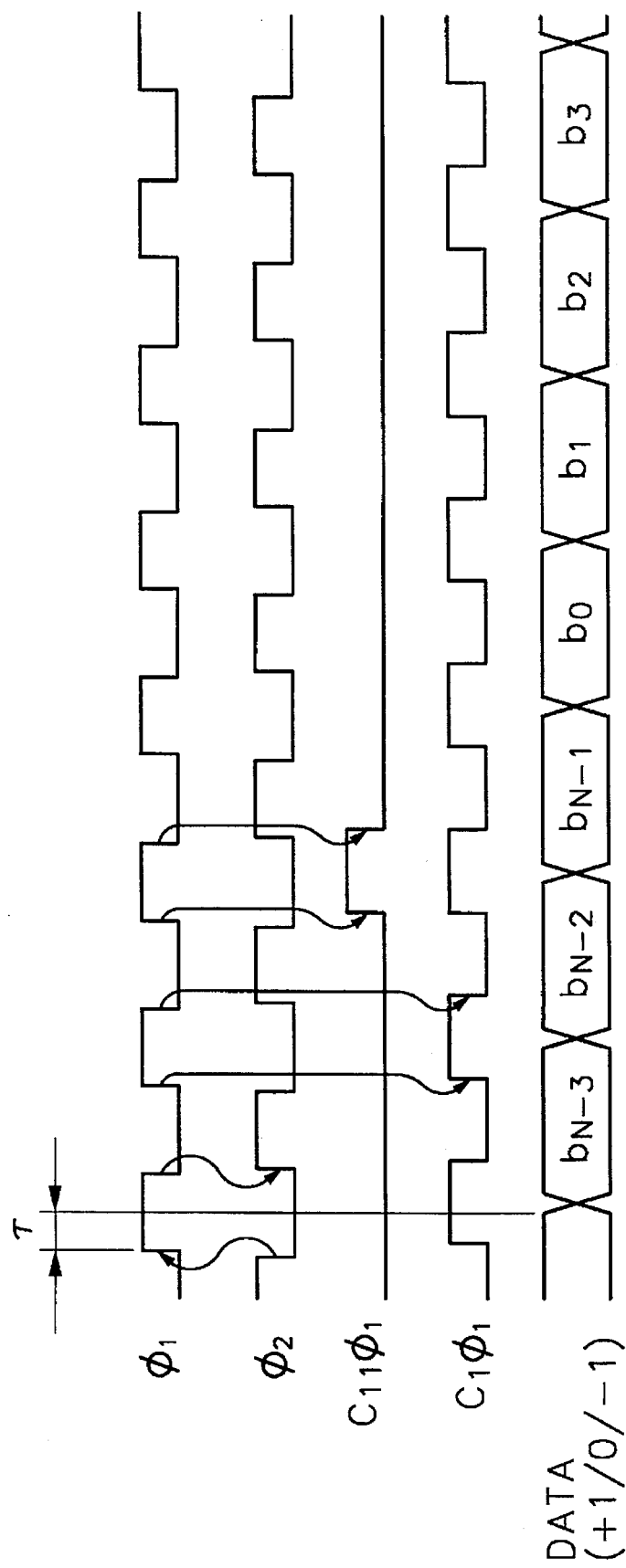
FIG. 15 is a timing diagram for the RSD algorithmic converter of FIG. 13.

Turning now to FIG. 14A, there is shown a schematic diagram of analog circuits in the RSD algorithmic converter 215 of FIG. 13. FIG. 14A shows that these analog circuits are implemented as balanced switched-capacitor circuits controlled by two clocks $\phi_1$ and $\phi_2$ at the same clock frequency. These two clocks, as further shown in FIG. 15, are non-overlapping and 180 degrees out of phase with respect to each other. The gains of the switched capacitor circuits 252, 256 in FIG. 14A are set by capacitor ratios. $+V_{ref}$ is 2.00 volts above the chip substrate voltage, $-V_{ref}$ is 0.00 volts with respect to the chip substrate voltage, and analog zero reference is at 1.00 volts above the chip substrate voltage. Plus full scale corresponds to a +2 volts differential analog input, and minus full scale corresponds to a −2 volts differential analog input.

FIG. 14A also shows that the two analog multiplexers 251 and 259 in FIG. 13 have been merged together to avoid series connections of analog switches. The analog zero selection is obtained by a switch 261 that shorts out the differential mode input signal. The circuits also have a pair of switches 262, 263 which are closed at the beginning of a conversion in order to clear the charge circulating in the feedback loop of the converter from the previous conversion.

Figure 14B:
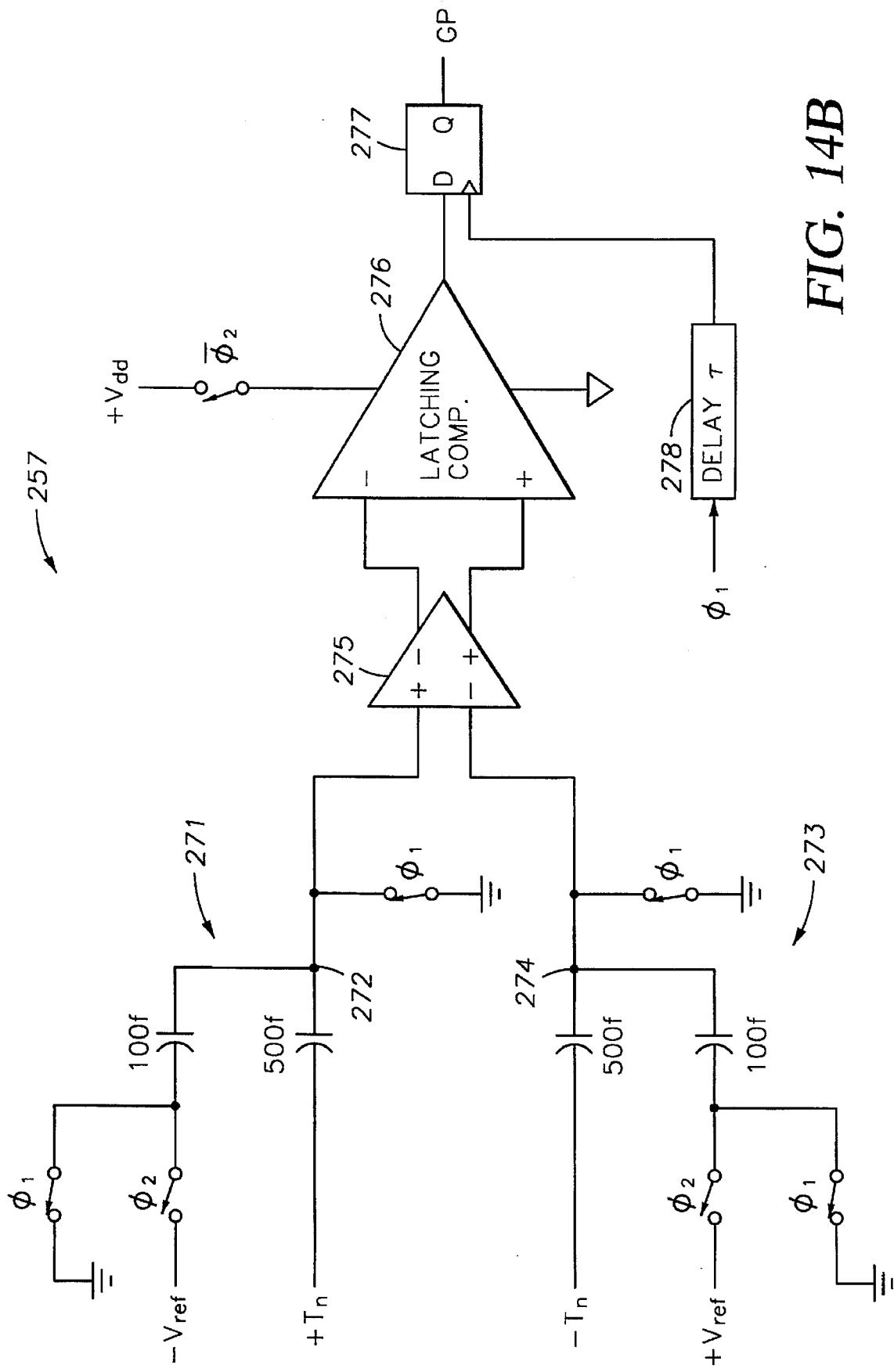
FIG. 14B is a schematic diagram of the positive-level comparator in the RSD algorithmic converter of FIG. 13.

Turning now to FIG. 14B, there is shown a schematic diagram of the positive-level comparator 257 in the RSD algorithmic converter of FIG. 13. A switched capacitor circuit 271 adds an offset of $-\frac{1}{5} V_{ref}$ to $+T_n$ at a summing node 272, and a switched capacitor circuit 273 adds and offset of $+\frac{1}{5} V_{ref}$ to $-T_n$ at a summing node 274. A differential amplifier 275 amplifies the difference between the voltages on the summing nodes 272, 274, and the difference is quantized and latched in a latching comparator 276 when $\phi_2$ is de-asserted. The output of the latching comparator 276 is delayed by a flip-flop 277 by a duration of time τ (shown in FIG. 15) to produce the binary signal GP. The duration of time τ is about a quarter of a cycle of the clock signal $\phi_1$. This delay is obtained by clocking the flip-flop 277 with a clock signal that is effectively obtained by a delay 278 in FIG. 14B of the clock signal $\phi_1$ by the duration of time τ.

The negative-level comparator 258 in FIG. 13 is the same as the positive-level comparator 257 as shown in FIG. 14B except that $+T_n$ and $-T_n$ would be interchanged.

The RSD converter 250 of FIG. 13 could be easily modified to be a redundant CR converter by omitting the second comparator 258 and modifying the first comparator 257 to have a zero threshold level so that the feedback from the first comparator provides $b_n$=+1 or −1. The comparator 257 would be modified to have a zero threshold level by omitting the circuits in FIG. 14B that are to the left of the differential amplifier 275, and connecting $+T_n$ to the positive input of the differential amplifier 257, and connecting $-T_n$ to the negative input of the differential amplifier 257.

Turning now to FIG. 15, there is shown a timing diagram illustrating the clocks $\phi_1$, $\phi_2$ and switch control signals $C_{11}\phi_1$ and $C_1\phi_1$ used in FIGS. 14A and 14B for the normal conversion mode. The electronic switches 251, 259 and 261 in FIG. 14A are also controlled by the signals Pl$\phi_2$, Mi$\phi_2$, and Z$\phi_2$ which are combinational logic functions of the comparator signals GP and LQ and the clock signal $\phi_2$ during normal conversion as illustrated by the following truth table:

| GP | LQ | $b_n$ | Pl$\phi_2$ | Mi$\phi_2$ | Z$\phi_2$ |
|----|----|----|----|----|----|
| 0 | 0 | 0 | 0 | 0 | $\phi_2$ |
| 0 | 1 | −1 | 0 | $\phi_2$ | 0 |
| 1 | 0 | +1 | $\phi_2$ | 0 | 0 |

During calibration conversions, the control signals Pl$\phi_2$ or Z$\phi_2$ are changed during the $b_{N-1}$ time frame shown in FIG. 15 so that the switches 251, 259 also perform the function of the calibration multiplexer 143" in FIG. 11A. In other words, when the calibration multiplexer 143" in FIG. 11A would select $+V_{ref}$ instead of $A_{in}$, the $A_{in}$ input is shorted to ground and Mi$\phi_2$ follows the $\phi_2$ signal during the $b_{N-1}$ time frame in FIG. 15, and when the calibration multiplexer 143" in FIG. 11A would select analog ground instead of $A_{in}$, the $A_{in}$ input is again shorted to ground and the Z$\phi_2$ control signal follows the $\phi_2$ signal during the $b_{N-1}$ time frame in FIG. 15.

Figure 16:
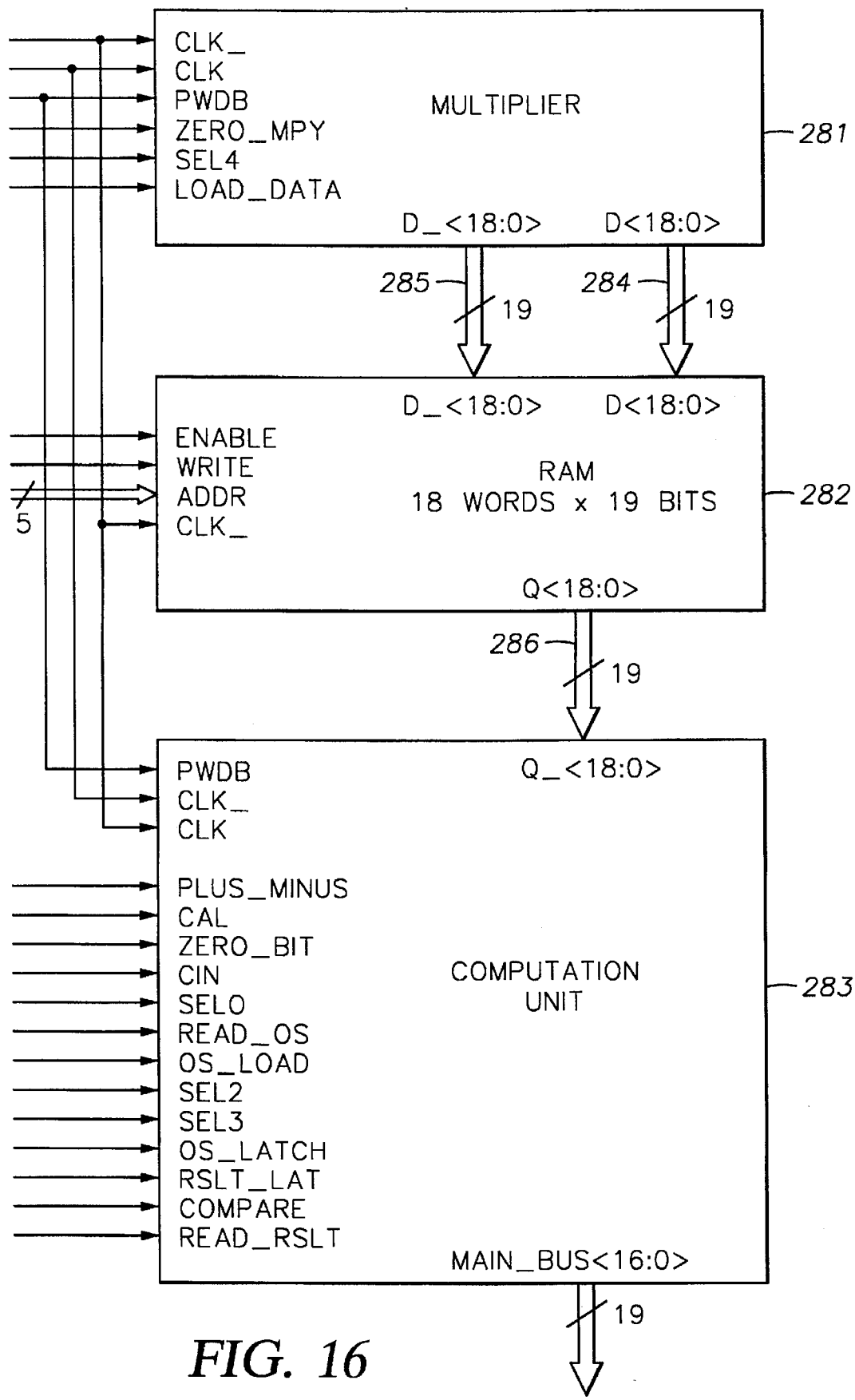
FIG. 16 is a block diagram of digital circuits for use with the RSD algorithmic converter of FIG. 13 for converting the redundant code to conventional binary code, and for digitally compensating the loop gain and loop offset of the converter.

Turning now to FIG. 16, there is shown a block diagram of digital circuits for use with the RSD algorithmic converter of FIG. 13 for converting the redundant code to conventional binary code, and for digitally compensating the loop gain and loop offset of the converter. The digital circuits include a multiplier unit 281, an 18 word×19 bit RAM 282, and a computation unit 283. The multiplier unit 281 is laid out above the RAM 282, and the computation unit 283 is laid out below the RAM 282. The multiplier unit 281 computes powers of the reciprocal of the loop gain or radix R, and writes the powers to the RAM 282 over a 19-bit data bus having true and complement lines 284, 285. The true and complement lines run vertically to static RAM cells. During a write operation, data from the multiplier is written to an addressed row of cells, corresponding to an addressed 19-bit word. During a read operation, data from an addressed word is written out to the computation unit 283 over a 19-bit data bus 286.

Figure 17:
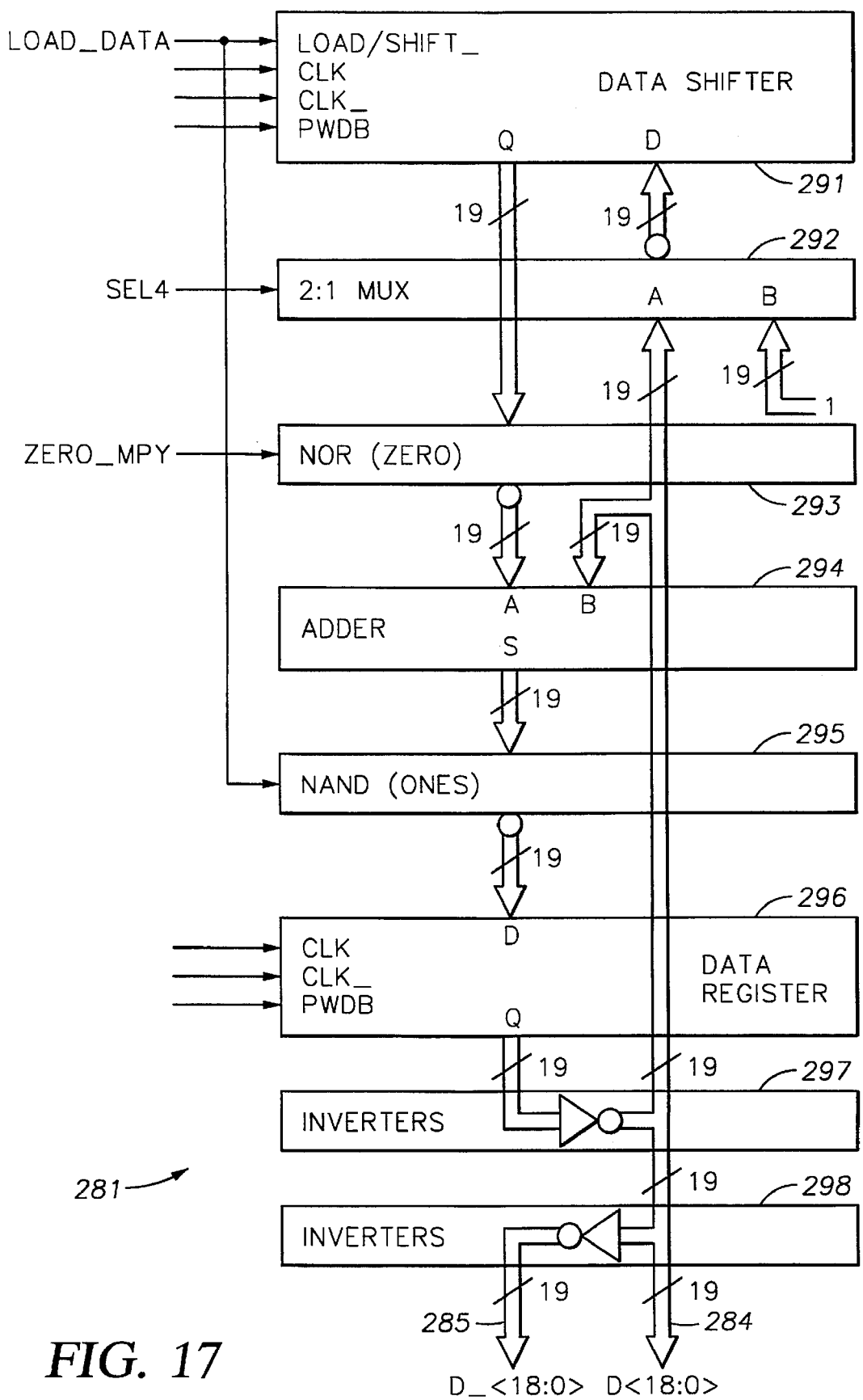
FIG. 17 is a layout diagram of the multiplier circuits in FIG. 16.

Turning now to FIG. 17, there is shown a layout diagram of the multiplier unit 281 introduced in FIG. 16. As further shown in FIG. 17, the multiplier unit 281 includes a 19-bit data shifter 291, a two-input multiplexer 292, a row of NOR gates 293, a 19-bit adder 294, a row of NAND gates 295, a 19-bit data register 296, a first row of inverters 297, and a second row of inverters 298. The multiplexer 292 corresponds to the multiplexer 134" in FIG. 11A, and the data register 296 corresponds to the power register 135" in FIG. 11A. The multiplexer 292 initially selects a normalized value of 1 wired onto its B input; in terms of the bits on the 19-bit B input, the MSB is a logic 1 and the other bits are logic 0.

When the data shifter 291 is loaded, the data register 296 is effectively cleared by the row of NAND gates 295. Although the data register 296 has all of its bits set by the NAND gates 295, the value from the data register 296 is asserted onto the data bus 284 by the inverters 297, so that the data register is effectively cleared. During a multiplication, after the data shifter 291 is loaded or performs a right shift, the NOR gates 293 either pass the 1's complement of the value in the data shifter or zero to the adder 294. Therefore, the control signal ZERO_MPY to the NOR gates 293 is formed by the sequence of bits (starting with the most significant bit) of the reciprocal of R from the radix register (131 in FIG. 10A) which is not shown in FIG. 17. The sign extension in the data shifter 291 is always zero, because all powers of the reciprocal of R are positive.

Figure 18A:
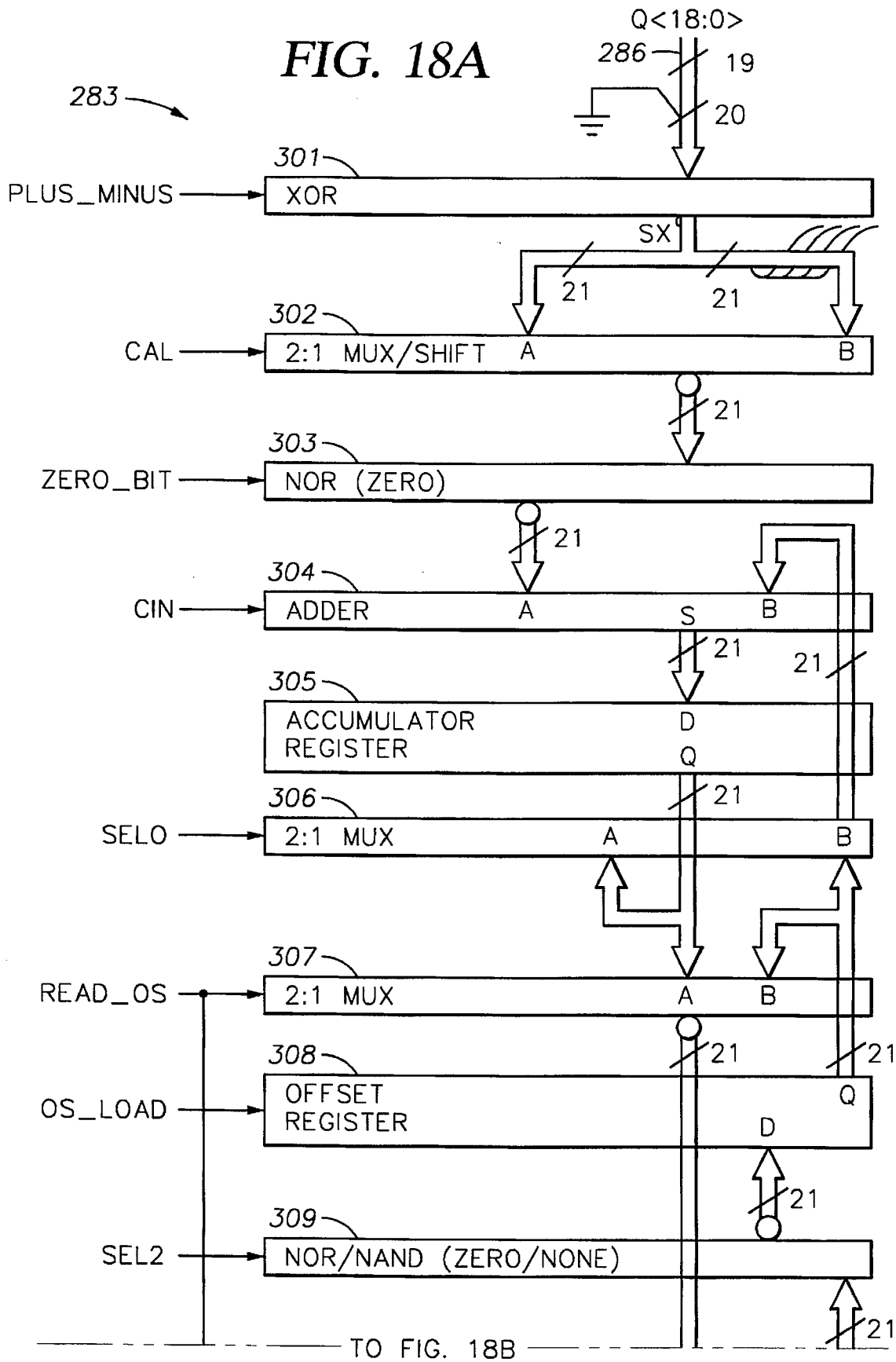
FIGS. 18A and 18B comprise a a layout diagram of the computational unit in FIG. 16.
Figure 18B:
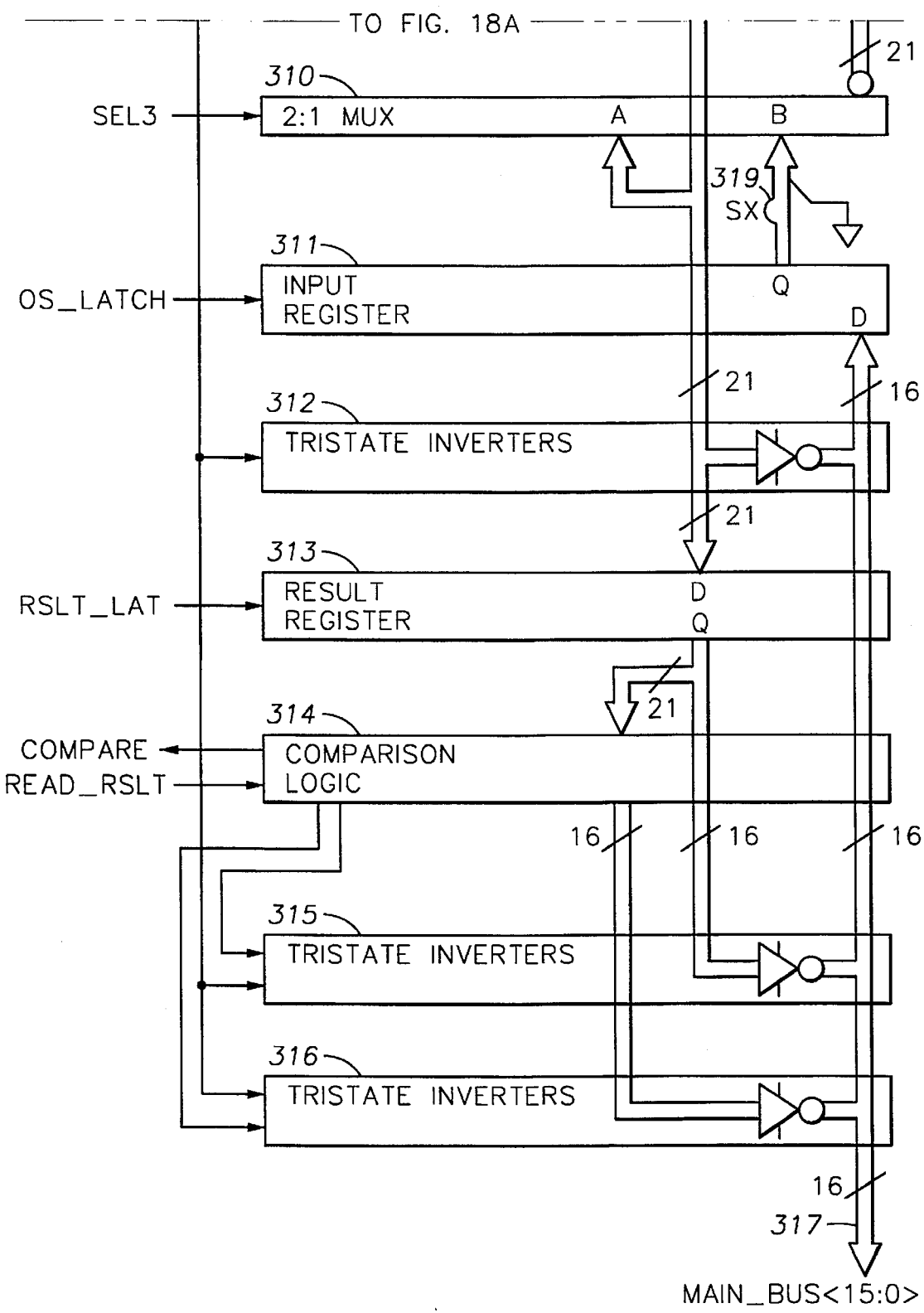

Turning now to FIGS. 18A and 18B, there is shown a layout diagram of the computational unit 283 introduced in FIG. 16. The computational unit includes a row of XOR gates 301 (FIG. 18A) forming a 1's complement unit, a 2-input multiplexer/shifter 302, a row of NOR gates 303 for selecting a zero value, a 21-bit adder 304, an accumulator register 305, a two-input multiplexer 306, a 2-input multiplexer 307, an offset register 308, a row of NOR/NAND gates 309 for selecting an initial value to be loaded into the offset register 308, a 2-input multiplexer 310, an input register 311, a row of tri-state inverters 312, a result register 313, comparison logic 314, a row of tri-state inverters 315, and a row of tri-state inverters 316.

The combination of the XOR gates 301 and the adder 304 correspond to the adder/subtractor 73" in FIG. 11B, and the NOR gates 303 correspond to the multiplexer 151 in FIG. 11. The 19-bit radix power from the bus 286 is a positive number, and it is extended to 20 bits by appending a logic zero to the MSB position. The 20 bits are received by the row of XOR gates 301. The sign bit of the 20-bit output of the XOR gates 301 is extended by one bit position to produce a 21-bit value.

The multiplexer 302 is an enhancement that is used for computing average values during calibration. Averaging during calibration filters out electrical noise that would prevent convergence of the reciprocal of the radix to a precise value. Averaging is performed by inhibiting the resetting of the accumulator register 305 between groups of sixteen consecutive conversions. Rather than divide the accumulated total by 16 to form an average value, during calibration the multiplexer 302 selects an arithmetically right-shifted version of the output of the XOR gates 301. The arithmetic right shift is performed by a sign extension and shift of four binary places in the wiring from the XOR gates 301 to the B input of the multiplexer 302, so that the radix powers are divided by sixteen.

The accumulator register 305 corresponds to the accumulator register 74" in FIG. 11B. The multiplexer 306 corresponds to the multiplexer 76" in FIG. 11B. The multiplexer 307 and tri-state inverters 312 are an enhancement that permits the value in the offset register 308 to be read and asserted on the 16-bit main bus 317 corresponding to the bus 145" in FIG. 11B. (The MSB and four least significant bits of the 21-bit value of the offset register are truncated to obtain the 16 bits asserted on the main bus 317.) The row of NOR/NAND gates 309 correspond to the multiplexer 144 in FIG. 10B or 144" in FIG. 11B. A NOR gate is used in each bit position of the offset register 308 to be set to a zero, and a NAND gate is used in each bit position of the offset register to be set to a one; moreover, the NOR gates are controlled by the SEL2 signal, and the NAND gates are controlled by a locally-inverted version of the SEL2 signal. When the computation unit 283 of FIGS. 18A and 18B is to be used with an RSD algorithmic converter and controlled in accordance with the state diagrams of FIGS. 19 to 22 as described below, then all NAND gates are used in the row 309.

The multiplexer 310 (FIG. 18B) and input register 311 permit the offset register 308 to be loaded from the main bus 317, and would also permit the contents of the offset register 308 to be swapped with the contents of the input register. Although these functions are not needed for the successive approximation procedure, the ability to read and write to the offset register from the main bus assists in the testing of the system and enables the offset to be adjusted externally, for example, for calibration of offset of a larger system that may use the algorithmic converter.

The bus 319 to the B input to the multiplexer 310 appends four logic zeros to the LSB position and performs a one-bit sign extension of the MSB to convert the 16-bit output of the input register to the 21-bit B input of the multiplexer 310.

The comparison logic 314 determines whether the value of the result register is less than or equal to a positive full scale value; if so, the COMPARE signal is asserted. For such a positive full scale value, MSB and MSB-1 of the 21-bit output of the result register are a logic 0 and the other bits of the 21-bit output are a logic 1. (The result register actually stores a 1's complement of the value of the result.) The compare logic also determines whether there is an over-range or under-range condition. An over-range condition is when the result is greater than the positive full scale value. An under-range condition is when the normalized value of the result register is less than the negative full scale value. In the absence of an over-range or under-range, so long as "READ_OS" is not asserted, the tri-state inverters 315 are activated to assert the result on the main bus 317; the MSB and the four least significant bits of the 21-bit result value are truncated to obtain the 16 bits asserted on the main bus 317. In the presence of an over-range condition, so long as "READ_OS" is not asserted, the comparison logic 314 and the tri-state inverters 316 assert a positive full scale value of "1111111111111111" on the main bus 317. In the presence of an under-range condition, so long as "READ OS" is not asserted, the comparison logic 314 and the tri-state inverters 316 assert a negative full scale value of "0000000000000000" on the main bus 317.

Figure 19:
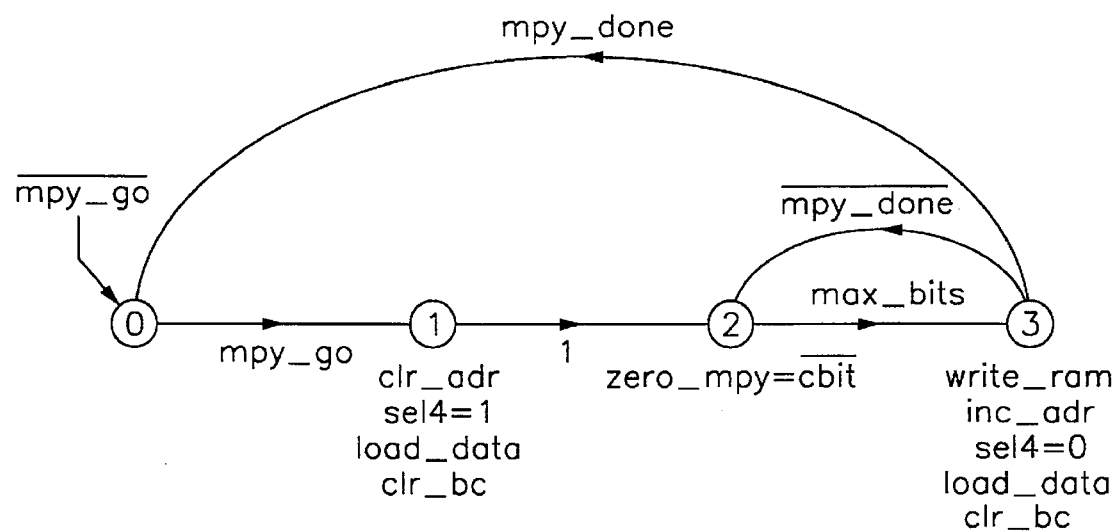
FIG. 19 is a state diagram for control of the multiplier circuits in FIG. 17.

Turning now to FIG. 19, there is shown a state diagram for control of the multiplier units 281 of FIG. 17 and the loading of the radix powers into the RAM 282 of FIG. 16. State 0 is an idle state. When a MPY_GO signal is asserted, the multiplier advances to state 1.

In state 1, a RAM address counter is cleared. The RAM address counter corresponds to the modulo-N counter 71" in FIG. 11A. Also in state 1, the SEL4 signal is set to a logic 1 so that the multiplexer 292 of FIG. 17 selects an input of "1" and the LOAD_DATA signal is asserted so that the "1" is loaded into the data shifter 291, and the data register 296 is cleared. In state 1 a bit counter is cleared. The bit counter points to an addressed bit (CBIT) in the radix register, and when the bit counter is cleared, it points to the MSB of the radix register.

In state 2, the ZERO_MPY control signal has a state that is the complement of the pointed-to bit of the radix register. Therefore, if the pointed-to bit is a zero, then the ZERO_MPY control signal is asserted so that a value of zero is added to the content of the data register and the sum is stored in the data register at the end of the clock cycle and therefore the content of the data register is unchanged during the clock cycle; otherwise, the content of the data shifter is added to the content of the data register, and the sum is stored in the data register at the end of the clock cycle. At the end of each clock cycle, the bit counter BC is incremented to point to the next less significant bit of the radix register, and the content of the data shifter is shifted right by one bit position. This process continues for a number of clock cycles until the bit counter points to the LSB of the radix register. At the end of the clock cycle for which the bit counter points to the LSB of the radix register (i.e., for MAX_BITS), the multiplication operation will be finished, and therefore control advances to state 3.

In state 3, the radix power is written from the data register 296 and into the RAM 282. At the end of the clock cycle, the RAM address is incremented. Then the SEL4 signal is set to a logic 0, and the LOAD_DATA signal is asserted, so that the content of the data register 296 is loaded into the data shifter 291 and the data register is cleared. The bit counter is also cleared. A RAM address of $17_{10}$ is decoded, to indicate whether the entire RAM has been loaded with radix powers, and if so, the multiplication is finished, a signal MPY_DONE is asserted, and the next state is the idle state. If not, then the next state is state 2, for the computation of another radix power.

Figure 20:
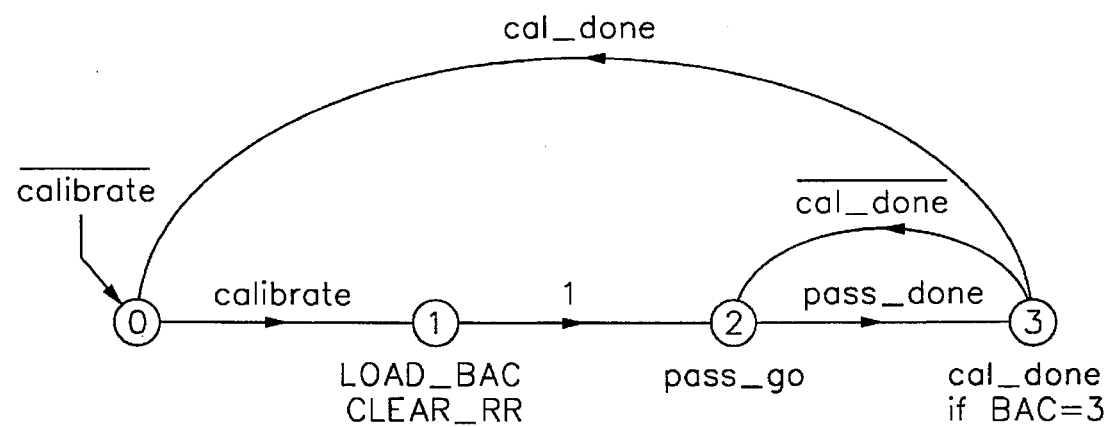
FIG. 20 is a high-level state diagram for control of calibration for the circuits in FIG. 16.

Turning now to FIG. 20, there is shown a high-level state diagram for control of calibration for the circuits in FIG. 16. State 0 is an idle state. Calibration is initiated when the CALIBRATE signal (FIG. 10A) is asserted, causing the next state to be state 1. In state 1, the radix register is cleared (CLEAR_RR) and the radix bit address register is loaded (LOAD_BAC) to point to the MSB of the radix register. The next clock cycle is state 2. In state 2, adjustment of the addressed radix bit is initiated by asserting a PASS_GO signal, and when a PASS_DONE signal is asserted (from FIG. 21), the next state is state 3. In state 3, the radix bit address is decoded to set a CAL_DONE signal if the radix bit address is 3; if so, the calibration is done and the next state is state 0; otherwise, the next state is state 2 to perform another iteration. Adjustment of the radix register stops before the LSB because adjustment of the four least significant bits for the converter system in FIGS. 13 to 18 is of no significant benefit; the four least significant bits of the radix register are wired so that LSB, LSB+1, and LSB+2 are logic zero, and LSB+3 is a logic one.

Figure 21:
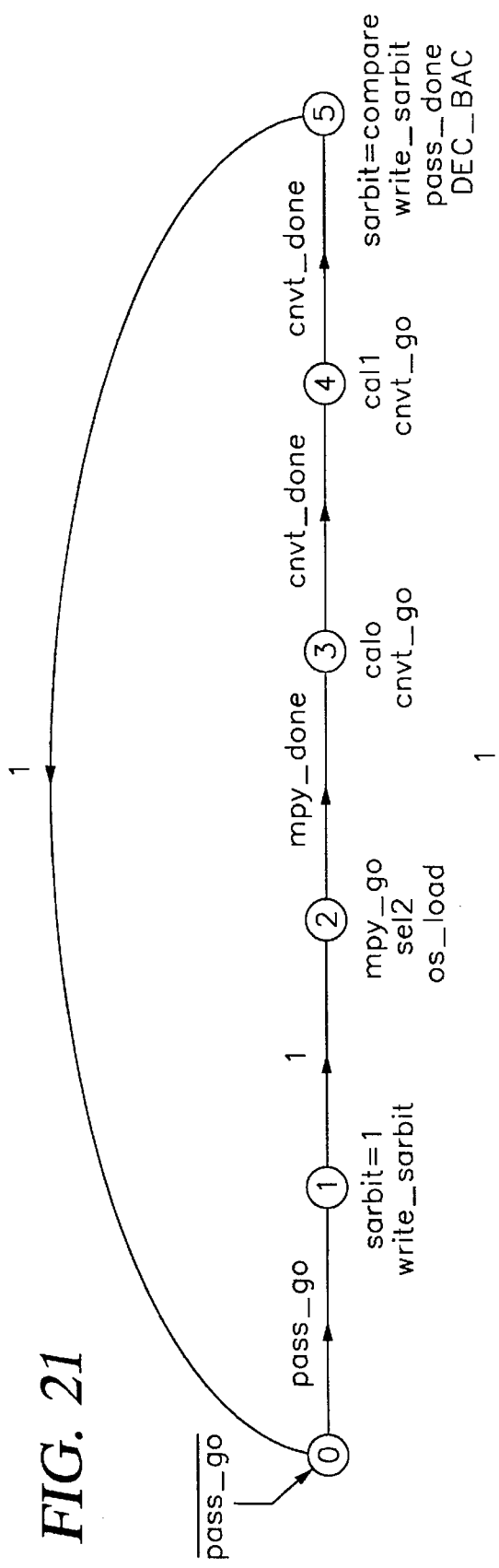
FIG. 21 is a low-level state diagram for control of calibration for the circuits in FIG. 16.

Turning now to FIG. 21, there is shown a low-level state diagram for control of calibration for the circuits in FIG. 16, in order to adjust an addressed bit of the radix register. The idle state is state 0. State 1 is reached from state 0 when PASS_GO is asserted. In state 1, the bit of the radix register addressed by the bit address counter is set. State 2 is reached at the next clock cycle. In state 2, the MPY_GO signal is asserted to compute the radix powers, and SEL2 and OS_LOAD are asserted to load the offset register (308 in FIG. 18) with its initial value (one's complement of −FS or 0). When MPY_DONE is asserted, indicating that the radix powers have been computed and loaded into RAM, the next state is state 3. In state 3, a signal CAL0 is asserted, causing the algorithmic converter to convert analog ground (i.e., a zero reference voltage; in this case the signal Z is asserted in FIG. 14A to close switch 261 during clock phase $\phi_2$). When the conversion is done, the next state is state 4. In state 4, a signal CAL1 is asserted, causing the algorithmic converter to convert $+V_{ref}$ (in this case the control signal Mi is asserted causing the multiplexer 259 in FIG. 14A to select a differential input signal having magnitude $+V_{ref}$). When the conversion is done, the next state is state 5. In state 5, the bit of the radix register addressed by the bit address counter is written with the comparator signal, so that the addressed bit is cleared if the converted value is greater than positive full scale. The PASS_DONE signal is asserted. Finally, the bit address counter is decremented. State 0 is reached during the next clock cycle.

Figure 22:
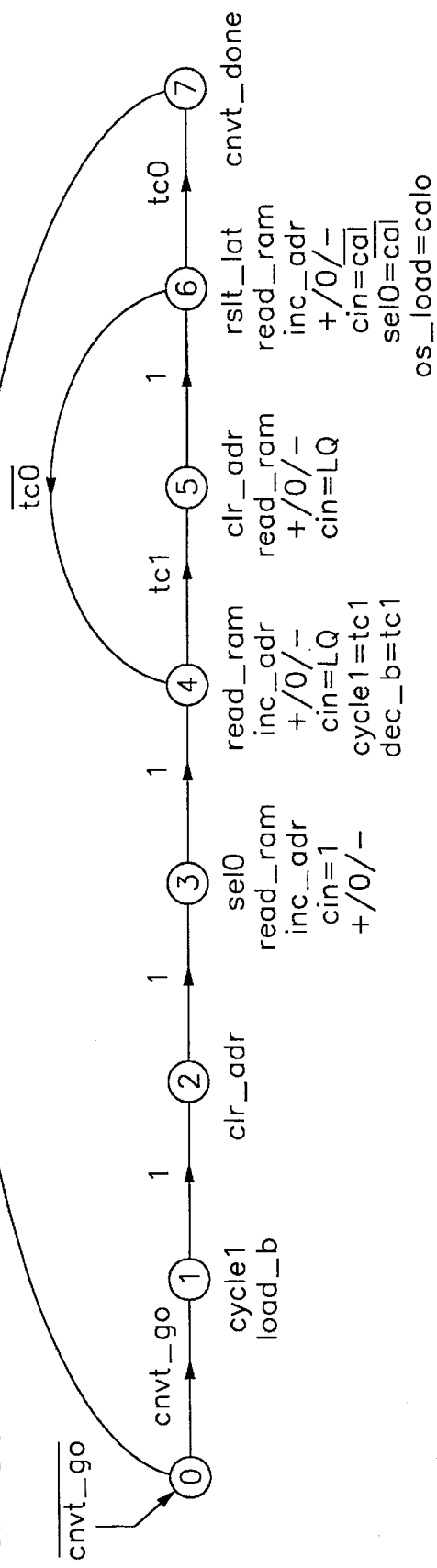
FIG. 22 is a state diagram for control of analog-to-digital conversion for the circuits in FIG. 16.

Turning now to FIG. 22, there is shown a state diagram for control of the computational unit 283 during a conversion. State 0 is an idle state. When the CNVT_GO signal is asserted, the next state is state 1. In state 1, a control signal CYCLE 1 is asserted, which in effect causes the analog multiplexer 251 of FIG. 13 to select $A_{in}$; otherwise, the analog multiplexer 251 does not select $A_{in}$. Also in state 1, a burst counter is loaded. If the converter is in calibration mode (CAL0 or CAL1 is asserted), then the burst counter is loaded with a value of 15; otherwise, the burst counter is loaded with a user-supplied value that is one less than a number of successive conversions desired by the user. State 2 is reached during the next clock cycle.

In state 2, the RAM address counter is cleared. State 3 is reached during the next clock cycle.

In state 3, SEL0 is asserted to select the contents of the offset register, the RAM is read, the RAM address is incremented, the signal CIN is asserted, and the PLUS_MINUS and ZERO_BIT signals are determined from the GP and LQ signals as PLUS_MINUS=LQ and ZERO_BIT=NOT (GP OR LQ). State 4 is reached during the next clock cycle.

In state 4, the RAM is read, the RAM address is incremented, the PLUS_MINUS and ZERO_BIT signals are determined from the GP and LQ signals as PLUS_MINUS=LQ and ZERO_BIT=NOT (GP OR LQ), the CIN bit is set to the value LQ, and the burst counter is decremented if the RAM address has reached a value of 17 decimal, as indicated by a RAM address decoder signal TC1. When the RAM address has reached a value of 17 decimal, the next state is state 5; otherwise, computation continues for at least another clock cycle in state 4.

In state 5, the RAM address is cleared, the RAM is read, the PLUS_MINUS and ZERO_BIT signals are determined from the GP and LQ signals as PLUS_MINUS=LQ and ZERO_BIT =NOT (GP OR LQ), and the CIN bit is set to the value LQ. State 6 is reached during the next clock cycle.

In state 6, the result register is loaded, the RAM is read, the RAM address is incremented, the PLUS_MINUS and ZERO_BIT signals are determined from the GP and LQ signals as PLUS_MINUS=LQ and ZERO_BIT=NOT (GP OR LQ), the CIN bit is set to the complement of control signal CAL=CAL0 OR CAL1, the SEL0 control signal is also set to the complement of the control signal CAL, and the OS_LOAD signal is set to the value of the control signal CAL0. The OS_LOAD signal causes the offset register to be loaded, and the one's complement of the result in the accumulator is loaded into the offset register due to the net inversion in the data path of FIG. 18 from the accumulator register 305, the multiplexer 307, the multiplexer 310, and the NOR/NAND gates 309 to the offset register 308. The carry-in (CIN) is set to 1 in state 3 and in state 6 for a non-calibration conversion in order to compensate for the fact that the offset register is loaded with the one's complement rather than the two's complement. State 7 is reached during the next clock cycle if the burst counter has a value of zero as indicated by a decoder signal TC0; otherwise, state 4 is reached during the next clock cycle.

In state 7, the CONV_DONE signal is asserted, and state 0 is reached during the next clock cycle.

In view of the above, there has been described an algorithmic converter system employing an algorithmic converter having a loop gain of substantially less than two. For an RSD algorithmic converter, the decreased loop gain prevents loop offset from causing the converted signal to be limited when the analog input signal is within the range of the reference voltage. For a CR algorithmic converter, the decreased loop gain prevents loop offsets from causing differential nonlinearities. Moreover, differential nonlinearity is further reduced by digitally compensating for loop gain. There has been described a digital compensation technique that basically uses the digital computation unit of the converter system and that compensates for both the loop gain and the loop offset of the algorithmic converter.

What is claimed is:

1. A method of converting an analog input signal to a digital output signal comprising the steps of:
   a) operating an algorithmic converter having a loop gain substantially less than two to convert said analog input signal to a redundant digital code; and
   b) operating a digital computation unit to convert said redundant digital code to a digital output signal by computing a polynomial of a radix, said radix being substantially equal to said loop gain, wherein said redundant digital code specifies coefficients of said polynomial; and
   wherein said polynomial is computed by operating an adder/subtractor to accumulate powers of said radix in an accumulator register, and said redundant code specifies an accumulation operation performed for each power of said radix.

2. The method as claimed in claim 1, wherein said method further includes measuring the loop gain of said algorithmic converter to determine a measured value of the loop gain, and setting said radix to the measured value of the loop gain.

3. The method as claimed in claim 1, wherein said method further includes setting said analog input signal to a first reference voltage, operating said algorithmic converter to determine a first set of digits of said redundant digital code corresponding to said first reference voltage, setting said analog input signal to a second reference voltage, operating said algorithmic converter to determine a second set of digits of said redundant digital code corresponding to said second reference voltage, and from said first set of digits and said second set of digits, computing said radix so that said radix is substantially equal to said loop gain.

4. The method as claimed in claim 1, wherein said loop gain is approximately 1.8.

5. The method as claimed in claim 1, wherein said loop gain is approximately 1.75.

6. A method of converting an analog input signal to a digital output signal comprising the steps of:
   a) operating an algorithmic converter having a loop gain substantially less than two to convert said analog input signal to a redundant digital code; and
   b) operating a digital computation unit to convert said redundant digital code to a digital output signal by computing a polynomial of a radix, said radix being substantially equal to said loop gain, wherein said redundant digital code specifies coefficients of said polynomial; and
   wherein said method includes setting said analog input signal to a reference voltage, comparing said digital output signal to a reference value, and adjusting said radix and recomputing said polynomial until said digital output signal becomes substantially equal to said reference value.

7. The method as claimed in claim 6, wherein said polynomial is computed with a constant term, and said method includes setting said analog input signal to a zero voltage level, operating said redundant algorithmic converter and said digital computation unit to convert said zero voltage level to an offset value, and setting said constant term to said offset value.

8. The method as claimed in claim 6, wherein said algorithmic converter has a maximum loop offset of $V_{offmax}$ and a reference voltage of $V_{ref}$, and said method includes selecting said loop gain to be less than $2/(1+V_{offmax}/V_{ref})$.

9. The method as claimed in claim 6, wherein said algorithmic converter has switched capacitors, and said method includes selecting a ratio of capacitance values of said switched capacitors in order to establish said loop gain.

10. The method as claimed in claim 6, wherein said redundant digital code is a binary code, and each of said coefficients of said polynomial specified by said redundant digital code has either a first value when the corresponding bit of said binary code has a first binary state or a second value when a corresponding bit of said binary code has a second binary state.

11. A method of converting an analog input signal to a digital output signal comprising the steps of:
   a) operating an algorithmic converter having a loop gain substantially less than two to convert said analog input signal to a redundant digital code; and
   b) operating a digital computation unit to convert said redundant digital code to a digital output signal by computing a polynomial of a radix, said radix being substantially equal to said loop gain, wherein said redundant digital code specifies coefficients of said polynomial; and
   wherein said polynomial is computed with a constant term, and wherein said method includes performing a plurality of successive iterations, each iteration including:
   (i) setting said analog input signal to a first reference voltage, initially setting said constant term to a first reference value, operating said redundant algorithmic converter and said digital computation unit to convert said first reference voltage to an offset value, and setting said constant term to said offset value; and
   (ii) setting said analog input signal to a second reference voltage, operating said redundant algorithmic converter and said digital computation unit to convert said second reference voltage to a digital output value, comparing said digital output value to a second reference value, and adjusting said radix in response to the comparing of said digital output value to said second reference value.

12. A method of measuring loop gain of an algorithmic converter providing sets of digits, each set of digits representing a converted value of an analog input signal, said method comprising the steps of: (a) setting said analog input signal to a first reference voltage, and operating said algorithmic converter to determine a first set of digits of said digital code corresponding to said first reference voltage; and (b) setting said analog input signal to a second reference voltage, and operating said algorithmic converter to determine a second set of digits of said digital code corresponding to said second reference voltage;

wherein said method includes computing said loop gain from said first set of digits and said second set of digits; and wherein said step of computing said loop gain from said first set of digits and said second set of digits includes computing an offset estimate $\hat{O}_i$:

$$\hat{O}_i = A_0/V_{ref} - (b_0'\hat{R}_i^{-1} + b_1'\hat{R}_i^{-2} + \ldots + b_{N-1}'\hat{R}_i^{-N})$$

where $A_0$ is said first reference voltage, $V_{ref}$ is a reference voltage of said algorithmic converter, $b_0', b_1', \ldots b_{N-1}'$ are said first set of digits of said digital code, and $\hat{R}$ is a nominal value of the loop gain, and then solving the polynomial equation $$0 = -A_1/V_{ref} + \hat{O}_i + b_0''R^{-1} + b_1''R^{-2} + \ldots + b_{N-1}''R^{-N}$$

where $A_2$ is said second reference voltage, and $b_0'', b_1'', \ldots, b_{N-1}''$ are the said second set of digits of said digital code, and R is the loop gain.

13. The method as claimed in claim 12 wherein said method includes solving said polynomial equation by successive approximations.

14. A method of converting an analog input signal to a digital output signal comprising the steps of:
   a) operating an algorithmic converter having a loop gain to convert said analog input signal to a digital code; and
   b) operating a digital computation unit to convert said digital code to a digital output signal by computing a polynomial of a radix, said radix being substantially equal to said loop gain, said digital code specifying coefficients of said polynomial;

wherein said method includes setting said analog input signal to a reference voltage, comparing said digital output signal to a reference value, and adjusting said radix and recomputing said polynomial until said digital output signal becomes substantially equal to said reference value.

15. The method as claimed in claim 14, wherein said method further includes averaging a number of polynomials computed from digital codes from a plurality of conversions of said reference voltage by said algorithmic converter to compute said digital output signal for comparison to said reference value.

16. The method as claimed in claim 15, wherein said method further includes computing said polynomial by operating an adder/subtractor to accumulate powers of said radix in an accumulator register, said code specifies an accumulation operation performed for each power of said radix, and the averaging of a number of polynomials is performed by inhibiting resetting of said accumulator register between computations of said polynomial.

17. A method of converting an analog input signal to a digital output signal comprising the steps of:
   a) operating an algorithmic converter having a loop gain to convert said analog input signal to a digital code; and
   b) operating a digital computation unit to convert said digital code to a digital output signal by computing a polynomial of a radix, said radix being substantially equal to said loop gain, said digital code specifying coefficients of said polynomial, and said polynomial having a constant term;

wherein said method includes a calibration sequence including:

setting said analog input signal to a zero voltage level, operating said algorithmic converter and said digital computation unit to convert said zero voltage level to an offset value, and setting said constant term to said offset value; and then setting said analog input signal to a reference voltage, comparing said digital output signal to a reference value, and adjusting said radix and re-computing said polynomial until said digital output signal becomes substantially equal to said reference value.

18. A method of converting an analog input signal to a digital output signal comprising the steps of:
   a) operating an algorithmic converter having a loop gain to convert said analog input signal to a digital code; and
   b) operating a digital computation unit to convert said digital code to a digital output signal by computing a polynomial of a radix, said radix being substantially equal to said loop gain, said digital code specifying coefficients of said polynomial, and said polynomial having a constant term;

wherein said method includes a calibration sequence including:
   c) setting said analog input signal to a first reference voltage, setting said constant term to a substantially non-zero first reference value, operating said algorithmic converter and said digital computation unit to convert said first reference voltage to an offset value, and setting said constant term to said offset value; and then
   d) setting said analog input signal to a second reference voltage, operating said redundant algorithmic converter and said digital computation unit to convert said second reference voltage to a digital value, comparing said digital value to a second reference value, and adjusting said radix in response to the comparing of said digital value to said second reference value.

19. The method as claimed in claim 18, which includes alternately performing each of steps c) and d) a plurality of times so that when said analog input signal is set to said first reference voltage, said digital output signal becomes substantially equal to said first reference value, and when said analog input signal is set to said second reference voltage, said digital output signal becomes substantially equal to said second reference value.

20. A successive-approximation method of adjusting gain and offset of a converter so that a first input reference value becomes converted to a first output reference value, and a second input reference value becomes converted to a second output reference value, wherein the gain and offset adjustments are not independent, said converter is responsive to a gain value for adjusting the gain of the converter, and said converter is responsive to an offset value for adjusting the offset of the converter, said method comprising the steps of:
   (a) setting said gain value to an initial value;
   (b) setting said offset value to an initial value corresponding to said first output reference value, and operating said converter to convert said first input reference value to a converted value to determine a new value for said offset value, and setting said offset value to said new value for said offset value; and
   (c) operating said converter to convert said second input reference value to a converted value, comparing said converted value to said second output reference value, and adjusting a bit of said gain value based on the comparing of said converted output value to said second output reference value;

wherein said steps (b) and (c) are repeated so that step (c) successively adjusts a series of consecutive bits of said gain value beginning with adjustment of a more significant bit and ending with adjustment of a less significant bit.

21. The method as claimed in claim 20, wherein said converter is an algorithmic analog-to-digital converter system including an algorithmic converter for converting an analog input signal to a series of digits and a digital computation unit for computing a polynomial of a radix value, said digits being coefficients of said polynomial, and said method includes adjusting said radix value in response to adjustment of said gain value.

22. The method as claimed in claim 21, wherein said polynomial includes a constant coefficient, and said method includes adjusting said constant coefficient in response to adjustment of said offset value.

23. An algorithmic converter system comprising:
an algorithmic converter having a loop gain substantially less than two for converting an analog input signal to a redundant digital code; and
a digital computation unit for converting said redundant digital code to a digital output signal by computing a polynomial of a radix, said radix being substantially equal to said loop gain, wherein said redundant digital code specifies coefficients of said polynomial;
wherein said redundant digital code is a binary code, and each of said coefficients of said polynomial specified by said redundant digital code has either a first value when the corresponding bit of said binary code has a first binary state or a second value when a corresponding bit of said binary code has a second binary state; and
wherein said first value is +1 and said second value is −1.

24. An algorithmic converter system comprising:
an algorithmic converter having a loop gain substantially less than two for converting an analog input signal to a redundant digital code; and
a digital computation unit for converting said redundant digital code to a digital output signal by computing a polynomial of a radix, said radix being substantially equal to said loop gain, wherein said redundant digital code specifies coefficients of said polynomial; and
wherein said redundant algorithmic converter is a redundant signed digit (RSD) algorithmic converter so that said redundant digital code is a three-state code, and each of said coefficients of said polynomial specified by said three-state code has either a first value when a corresponding digit of said three-state code has a first state or a second value when the corresponding digit of said three-state code has a second state or a third value when the corresponding digit of said three-state code has a third state.

25. The algorithmic converter as claimed in claim 24, wherein said first value is +1, said second value is 0, and said third value is −1.

26. An algorithmic converter system comprising:
an algorithmic converter having a loop gain substantially less than two for converting an analog input signal to a redundant digital code; and
a digital computation unit for converting said redundant digital code to a digital output signal by computing a polynomial of a radix, said radix being substantially equal to said loop gain, wherein said redundant digital code specifies coefficients of said polynomial; and
wherein said digital computation unit includes a power table memory containing powers of said radix, an accumulator register, and an adder/subtractor unit; and said adder/subtractor unit has an output coupled to said accumulator register for loading a result of said adder/subtractor unit in said accumulator register, a first input coupled to said accumulator register for receiving a previous result having been loaded into said accumulator register, a second input coupled to said power table memory for receiving a power of said radix from said power table memory, and a control input responsive to said redundant digital code for operating said adder/subtractor as either an adder or a subtractor for computing said polynomial.

27. The algorithmic converter system as claimed in claim 26, wherein said digital computation unit includes a register for storing a value that specifies said radix, and means for determining said value that specifies said radix so that said digital output signal has a reference value when said analog input is at a reference voltage level.

28. The algorithmic converter system as claimed in claim 27, wherein said reference value is a full-scale value of said digital output signal.

29. The algorithmic converter system as claimed in claim 27, wherein said digital computation unit further includes a register for storing an offset value specifying a constant coefficient for said polynomial, and means for computing said offset value so that said digital output signal has a value of substantially zero when said analog input signal is at a zero voltage level.

30. An algorithmic converter system comprising:
an algorithmic converter having a loop gain for converting an analog input signal to a digital code; and
a digital computation unit for converting said digital code to a digital output signal by computing a polynomial of a radix, said radix being substantially equal to said loop gain, said digital code specifying coefficients of said polynomial;
wherein said digital computation unit includes a radix register for storing a value that specifies said radix, and means for determining said value that specifies said radix so that said digital output has a reference value when said analog input is at a reference voltage level; and
wherein said means for determining said value that specifies said radix includes means for setting said analog input signal to said reference voltage and means for adjusting said value in said radix register so that said digital output signal assumes a value that is substantially equal to said reference value.

31. The algorithmic converter system as claimed in claim 30, wherein said reference value is a full-scale value of said digital output signal.

32. The algorithmic converter system as claimed in claim 30, wherein said means for adjusting includes means for successively adjusting individual bits in said radix register beginning with a most significant bit in said radix register and successively re-computing said digital output signal and comparing the re-computed digital output signal to said reference value and selectively re-adjusting each adjusted bit in response to the comparing of the re-computed digital output signal to said reference value.

33. The algorithmic converter system as claimed in claim 30, wherein said digital computation unit further includes an offset register for storing an offset value specifying a constant coefficient for said polynomial, and means for computing said offset value so that said digital output has a value of substantially zero when said analog input is at a zero voltage level.

34. An algorithmic converter system comprising:
an algorithmic converter having a loop gain for converting an analog input signal to a digital code; and
a digital computation unit for converting said digital code to a digital output signal by computing a polynomial of a radix, said radix being substantially equal to said loop gain, said digital code specifying coefficients of said polynomial;
wherein said digital computation unit includes a radix register for storing a value that specifies said radix, and means for determining said value that specifies said radix so that said digital output has a reference value when said analog input is at a reference voltage level; and
wherein said means for determining said value in said radix register includes means for computing an average digital output value from a plurality of digital codes from a plurality of conversions of said analog input signal by said algorithmic converter when said analog input signal is set to said reference voltage, and means for adjusting said value in said radix register so that said average digital output value becomes substantially equal to said reference value.

35. An algorithmic converter system comprising:
an algorithmic converter having a loop gain for converting an analog input signal to a digital code; and
a digital computation unit for converting said digital code to a digital output signal by computing a polynomial of a radix, said radix being substantially equal to said loop gain, said digital code specifying coefficients of said polynomial;
wherein said digital computation unit includes a radix register for storing a value that specifies said radix, and means for determining said value that specifies said radix so that said digital output has a reference value when said analog input is at a reference voltage level;
wherein said digital computation unit further includes an offset register for storing an offset value specifying a constant coefficient for said polynomial, and means for computing said offset value so that said digital output has a value of substantially zero when said analog input is at a zero voltage level; and
wherein said means for determining said offset value includes means for setting said analog input signal to said zero voltage level and operating said algorithmic converter and said digital computation unit to convert said zero voltage level to said offset value, and said means for determining said value that specifies said radix includes means for setting said analog input signal to said reference voltage level and adjusting said value in said radix register so that said digital output signal assumes a value that is substantially equal to said reference value.

36. An algorithmic converter system comprising:
an algorithmic converter having a loop gain for converting an analog input signal to a digital code; and
a digital computation unit for converting said digital code to a digital output signal by computing a polynomial of a radix, said radix being substantially equal to said loop gain, said digital code specifying coefficients of said polynomial;
wherein said digital computation unit includes a radix register for storing a value that specifies said radix, and means for determining said value that specifies said radix so that said digital output has a reference value when said analog input is at a reference voltage level; and
wherein said digital computation unit includes a multiplier connected to said radix register for computing powers of said radix, a power table memory connected to said multiplier for storing the powers of said radix computed by said multiplier, an accumulator register, and an adder/subtractor unit; and said adder/subtractor unit has an output coupled to said accumulator register for loading a result of said adder/subtractor unit in said accumulator register, a first input coupled to said accumulator register for receiving a previous result having been loaded into said accumulator register, a second input coupled to said power table memory for receiving a power of said radix from said power table memory, and a control input responsive to said digital code for operating said adder/subtractor as either an adder or a subtractor for computing said polynomial.

37. An algorithmic converter system comprising:
an algorithmic converter having a loop gain for converting an analog input signal to a digital code; and
a digital computation unit for converting said digital code to a digital output signal by computing a polynomial of a radix, said radix being substantially equal to said loop gain, said digital code specifying coefficients of said polynomial;
wherein said digital computation unit includes an offset register for storing an offset value specifying a constant coefficient for said polynomial, and means for computing said offset value by setting said analog input signal to a first reference voltage and operating said algorithmic converter and said computational unit for converting said analog input signal to a first digital value and computing said offset value as a difference between said first digital value and a first reference value; and
wherein said digital computation unit includes a radix register for storing a value that specifies said radix, and means for determining said value that specifies said radix by setting said analog input signal to a second reference voltage and operating said algorithmic converter and said computational unit for converting said analog input signal to a second digital value, comparing said second digital value to said second reference value, and in response to the comparing of said second digital value to said second reference value, adjusting said value that specifies said radix so that said analog input signal is converted by said algorithmic converter and said computational unit to a digital value approximately equal to said second reference value.

38. The algorithmic converter system as claimed in claim 37, wherein said reference values are positive and negative binary numbers having substantially the same magnitude.

39. The algorithmic converter system as claimed in claim 38, wherein said reference values are a positive full scale value and a negative full scale value.

40. The algorithmic converter system as claimed in claim 37, further comprising means for alternately operating said means for computing said offset value and said means for determining said value that specifies said radix so that each of said means for computing said offset value and said means for determining said value that specifies said radix is each operated a plurality of times in succession to determine a single offset value and a single value that specifies said radix for use in a normal conversion mode.

41. An algorithmic converter system comprising:
an algorithmic converter having a loop gain for converting an analog input signal to a digital code; and
a digital computation unit for converting said digital code to a digital output signal by computing a polynomial of a radix, said radix being substantially equal to said loop gain, said digital code specifying coefficients of said polynomial, wherein said digital computation unit includes a successive-approximation register for storing a value that specifies said radix, an offset register for storing an offset value specifying a constant coefficient for said polynomial, an analog multiplexer for setting said analog input signal to a zero voltage level or to a reference voltage level, a numerical comparator for comparing said digital output signal to a reference value, and a calibration controller operative in a calibration mode for controlling said analog multiplexer to set said analog input signal to said zero voltage level and to load in said offset register a digital output signal computed by said computation unit from digital code converted by said algorithmic converter when said analog input signal is set to said zero voltage level, and then to control said analog multiplexer to set said analog input signal to said reference voltage level and to successively adjust bits in said successive approximation register in response to said numerical comparator.

42. The algorithmic converter system as claimed in claim 41, wherein said reference value is a full-scale value of said digital output signal.

43. The algorithmic converter system as claimed in claim 41, wherein said algorithmic converter is a redundant signed digit (RSD) algorithmic converter so that said digital code is a three-state code, and each of said coefficients of said polynomial specified by said three-state code has either a first value when a corresponding digit of said three-state code has a first state or a second value when the corresponding digit of said three-state code has a second state or a third value when the corresponding digit of said three-state code has a third state.

44. The algorithmic converter system as claimed in claim 41, wherein said digital computation unit includes a multiplier connected to said register for computing powers of said radix, a power table memory connected to said multiplier for storing the powers of said radix computed by said multiplier, an accumulator register, and an adder/subtractor unit, and a multiplexer; said multiplexer has a first data input coupled to said offset register for receiving the offset value from said offset register and a second data input connected to said accumulator register to receive a data value from said accumulator register, and a data output providing a selected value; and said adder/subtractor unit has an output coupled to said accumulator register for loading a result of said adder/subtractor unit in said accumulator register, a first input coupled to said data output of said multiplexer for receiving the selected value, a second input coupled to said power table memory for receiving a power of said radix from said power table memory, and a control input responsive to said digital code for operating said adder/subtractor as either an adder or a subtractor for computing said polynomial.

45. An algorithmic converter system comprising:

an algorithmic converter having a loop gain substantially less than two for converting an analog input signal to a redundant binary digital code; and a digital computation unit for converting said redundant digital code to a digital output signal by computing a polynomial of a radix, said radix being substantially equal to said loop gain, said redundant digital code specifying coefficients of said polynomial, wherein each of said coefficients of said polynomial specified by said redundant binary code has either a first value when the corresponding bit of said redundant binary code has a first binary state or a second value when a corresponding bit of said binary code has a second binary state;

wherein said digital computation unit includes a successive-approximation register for storing a value that specifies said radix, an offset register for initially storing a first reference value and for storing at a later time an offset value specifying a constant coefficient for said polynomial, an analog multiplexer for setting said analog input signal to a first reference voltage or to a second reference voltage, a numerical comparator for comparing said digital output signal to a second reference value, and a calibration controller operative in a calibration mode for controlling a plurality of successive iterations, each iteration including:

a) controlling said analog multiplexer to set said analog input signal to said first reference voltage and to control said computational unit to initially load in said offset register said first reference value, and to use said first reference value as a constant coefficient of said polynomial during computation of said offset value from redundant digital code converted by said redundant algorithmic converter when said analog input signal is set to said first voltage level, and to load said offset value in said offset register, and then b) controlling said analog multiplexer to set said analog input signal to said reference voltage level and to adjust selected bits in said successive approximation register in response to said numerical comparator during computation of said digital output signal from redundant digital code converted by said redundant algorithmic converter when said analog input signal is set to said second reference value so that said digital output signal is driven toward said second reference value when said analog input is set to said reference voltage level, so that after said plurality of successive iterations, when said analog input is at said first reference voltage, said digital output is approximately equal to said first reference value, and when said analog input is at said second reference voltage, said digital output is approximately equal to said second reference value.

46. The algorithmic converter system as claimed in claim 45, wherein said reference values are positive and negative binary numbers having substantially the same magnitude.

47. The algorithmic converter system as claimed in claim 45, wherein said reference values are a positive full scale value and a negative full scale value.

48. The algorithmic converter system as claimed in claim 45, wherein said digital computation unit includes a multiplier connected to said register for computing powers of said radix, a power table memory connected to said multiplier for storing the powers of said radix computed by said multiplier, an accumulator register, and an adder/subtractor unit, and a multiplexer; said multiplexer has a first data input coupled to said offset register for receiving the offset value from said offset register and a second data input connected to said accumulator register to receive a data value from said accumulator register, and a data output providing a selected value; and said adder/subtractor unit has an output coupled to said accumulator register for loading a result of said adder/subtractor unit in said accumulator register, a first input coupled to said data output of said multiplexer for receiving the selected value, a second input coupled to said power table memory for receiving a power of said radix from said power table memory, and a control input responsive to said redundant binary code for operating said adder/subtractor as either an adder or a subtractor for computing said polynomial.

* * * * *